United States Patent [19]

Davis et al.

[11] Patent Number: 5,789,969
[45] Date of Patent: Aug. 4, 1998

[54] DIGITAL DELAY CIRCUIT AND METHOD

[75] Inventors: Barry A. Davis, Union City; Salil Suri, Fremont; John P. Stubban, Redding, all of Calif.

[73] Assignee: Adaptec, Inc., Milpitas, Calif.

[21] Appl. No.: 617,994

[22] Filed: Mar. 15, 1996

[51] Int. Cl.$^6$ .............................. H03K 5/14; H03K 5/19
[52] U.S. Cl. .......................... 327/276; 327/284; 327/279
[58] Field of Search .................................. 327/261, 262, 327/264, 265, 269–273, 276–279, 284–286, 291, 293–296, 99; 331/57

[56] References Cited

U.S. PATENT DOCUMENTS

| | | | |
|---|---|---|---|
| 4,458,165 | 7/1984 | Jackson | 327/276 |
| 4,504,749 | 3/1985 | Yoshida | 327/276 |
| 5,049,766 | 9/1991 | Van Driest et al. | 327/276 |
| 5,329,188 | 7/1994 | Sikkink et al. | 327/261 |
| 5,451,894 | 9/1995 | Guo | 327/277 |
| 5,465,076 | 11/1995 | Yamauchi et al. | 327/279 |

*Primary Examiner*—Timothy P. Callahan
*Assistant Examiner*—Eunja Shin
*Attorney, Agent, or Firm*—Skjerven, Morrill, MacPherson, Franklin, Friel LLP; Forrest E. Gunnison

[57] ABSTRACT

A digital delay circuit structure includes a digital calibration circuit and a digital delayed signal generator. The digital delay circuit is automatically calibrated when a calibrate signal goes active. Once the auto-calibration process is completed, the circuit switches back to a normal delay mode operation where the digital delay circuit remains until the next transition of the calibrate signal. A calibration control circuit generates a sample gate signal which initiates a feedback signal to the input terminal delay chain circuit that causes the delay chain output signal to oscillate. A calibration counter circuit counts the oscillations and couples this information to a count decoder circuit which in turn generates a signal to select one of a plurality of taps in the delay chain circuit. The digital delay circuit automatically compensates for delay variations caused by process extremes, temperature, and average voltage changes.

26 Claims, 25 Drawing Sheets

| TAP SELECT | COUNT VALUE | COUNTER OUTPUT BITS | | | | |
|---|---|---|---|---|---|---|
| | | CAL4 | CAL3 | CAL2 | CAL1 | CAL0 |
| 1 | 8 | 0 | 1 | 0 | 0 | 0 |
| | 9 | 0 | 1 | 0 | 0 | 1 |
| | 10 | 0 | 1 | 0 | 1 | 0 |
| 2 | 11 | 0 | 1 | 0 | 1 | 1 |
| | 12 | 0 | 1 | 1 | 0 | 0 |
| 3 | 13 | 0 | 1 | 1 | 0 | 1 |
| | 14 | 0 | 1 | 1 | 1 | 0 |
| | 15 | 0 | 1 | 1 | 1 | 1 |
| 4 | 16 | 1 | 0 | 0 | 0 | 0 |
| | 17 | 1 | 0 | 0 | 0 | 1 |
| | 18 | 1 | 0 | 0 | 1 | 0 |
| 5 | 19 | 1 | 0 | 0 | 1 | 1 |
| | 20 | 1 | 0 | 1 | 0 | 0 |
| | 21 | 1 | 0 | 1 | 0 | 1 |
| | 22 | 1 | 0 | 1 | 1 | 0 |
| 6 | 23 | 1 | 0 | 1 | 1 | 1 |
| | 24 | 1 | 1 | 0 | 0 | 0 |
| | 25 | 1 | 1 | 0 | 0 | 1 |
| | 26 | 1 | 1 | 0 | 1 | 0 |
| | 27 | 1 | 1 | 0 | 1 | 1 |
| | 28 | 1 | 1 | 1 | 0 | 0 |

FIG. 4C

| COUNT = 8 ||
|---|---|
| Q0 = 0 | QB0 = 1 |
| Q1 = 0 | QB1 = 1 |
| Q2 = 0 | QB2 = 1 |
| Q3 = 1 | QB3 = 0 |

DIGITAL DELAY CIRCUIT AND METHOD

FIELD OF THE INVENTION

This invention relates generally to signal delay circuits and more specifically to digital delay circuits that include only digital circuit components and that automatically compensate for delay variations caused by process extremes, temperature changes, and average voltage changes, for example.

BACKGROUND OF THE INVENTION

In many electronic devices used for signal processing it is desirable to provide a signal delay time prior to applying the signal to other portions of the system. However, prior art delay circuitry often used analog elements which added to the cost and the production time of the circuit and made the delay circuitry impractical for some forms of semiconductor technology.

In addition, prior art delay circuits often produce only relatively long delay periods, or require high frequency clocks which also add to the expense of the system and reduce the efficiency of the circuits. Further, prior art delay circuits often require extensive post fabrication processing such as laser trimming.

Once a delay time is determined for prior art delay circuits, the delay time is typically set and cannot be adjusted to compensate for variations in circuit operating parameters. Consequently, prior art delay circuits often cannot provide the flexibility and accuracy required by specialized circuitry such as deglitching filters and data separators.

To overcome these limitations, a digital delay circuit is needed that can be constructed to provide any desired delay accuracy, does not include analog elements, requires no post fabrication processing, and is relatively simple and inexpensive to employ with existing semiconductor technology.

SUMMARY OF THE INVENTION

According to the principals of this invention, a digital delay circuit utilizes only standard digital circuit components. Therefore, the prior art problems associated with analog components in delay circuitry have been eliminated. Since only standard digital components are used, the digital delay circuits of this invention can be used with any standard semiconductor technology and no post fabrication processing, such as laser trimming, is required.

The digital delay circuit can produce relatively short signal delay times without requiring a special high frequency clock. Further, the digital delay circuit generates delay times which have a delay time accuracy within about plus or minus two inverter delays. Consequently, the digital delay circuit of this invention is suitable for use in deglitching filters, data separators, or any other circuitry which requires a signal delay time more accurate than can be provided by a simple inverter chain.

Another important feature of this invention, is that the delay time associated with the digital delay circuit of this invention is not fixed. Rather in response to an active calibration signal, the digital delay circuit enters an auto-calibration mode. In the auto-calibration mode of operation, the digital delay circuit determines a calibrated delay time that automatically compensates for delay variations caused by process extremes, temperature changes, and average voltage changes.

During the auto-calibration mode of operation, an output signal of a delay chain circuit is fed back to the delay chain circuit input line, causing the output signal to oscillate. The oscillations are counted to determine the actual time delay of the individual elements that make up the delay chain circuit. The actual time delay is used to determine what fraction of the same delay chain circuit to use to provide a desired time delay.

Since the same components, i.e., the delay chain circuit, are used to determine the signal time delay and to provide the desired delay time, if the digital delay circuit is operated in the auto-calibration mode at regular intervals, or prior to delaying any signal, any change in the signal time delay through the delay chain circuit is also present when the delay chain circuit is used to provide the oscillation count. Therefore, any change in the signal time delay is automatically taken into account and canceled out.

In one embodiment, the digital delay circuit includes a digital calibration circuit and a digital delayed signal generator. The digital calibration circuit has a sample gate output line. In an auto-calibration operation mode of the digital delay circuit, the digital calibration circuit generates a sample gate signal having a first state, e.g., an active signal, on the sample gate output line.

The digital delayed signal generator has a signal input line; a delayed signal output line; a feedback input terminal; and a feedback line connected to the digital calibration circuit and to the feedback input terminal of the digital delayed signal generator. The digital delayed signal generator also includes a digital signal delay chain having an input terminal coupled to the signal input line and to the feedback input terminal, and a plurality of signal delay taps, as well as an input signal select terminal connected to the sample gate output line.

In response to the sample gate signal having a second level on the sample gate output line, the signal input line of the digital delay signal generator is connected to the input terminal of the delay chain for a normal mode of operation. In response to the sample gate signal having the first level, the feedback terminal is connected to the input terminal of the delay chain, and a delay tap in the plurality of signal delay taps having a specified time delay is connected to the feedback line. Thus, the digital signal delay chain is used in both the auto-calibration mode of operation and in the normal mode of operation.

The digital calibration circuit includes a calibration control input line and the digital calibration circuit generates the sample gate signal having a first state in response to an active signal on the calibration control input line. In particular, a calibration control logic circuit connected to the calibration control input line and to the sample gate output line generates the sample gate signal having the first state on the sample gate output line in response to the active signal on the calibration control input line.

The digital calibration circuit also includes a calibration counter circuit connected to the sample gate output line, and to the feedback line. In response to the sample gate signal, the calibration counter circuit counts a signal on the feedback line. Output signals on a counter output bus are supplied to a count decoder circuit. In response to the signals on the counter output bus, the count decoder circuit generates signals on a delay time select bus to select a time delay for the normal mode of operation.

The signals on the delay time select bus are supplied to an output signal selector in the digital delayed signal generator. The output signal selector is also connected to the plurality of signal delay taps, the feedback line, the delayed signal output line, and the sample gate output line. In response to

3 a sample gate signal having the second level on the sample gate output line and the signals on the delay time select bus, the output signal selector passes one signal from the plurality of signal delay taps to the delayed signal output line. In response to the sample gate signal having the first level, the output signal selector connects the delay tap in the plurality of signal delay taps having a specified time delay to the feedback line.

In one embodiment, the digital signal delay chain comprises a ring oscillator. In another embodiment, the digital signal delay chain comprises a plurality of logic gates.

As explained above, the delayed signal output line can be coupled to a filter, such as a deglitching filter. The delayed signal output line can also be coupled to a data separator.

BRIEF DESCRIPTION OF THE DRAWINGS

FIG. 4C shows the binary output signals from the calibration counter circuit of FIGS. 4A and 4B for oscillation counts of 8 to 28.

4

Figure 12A:
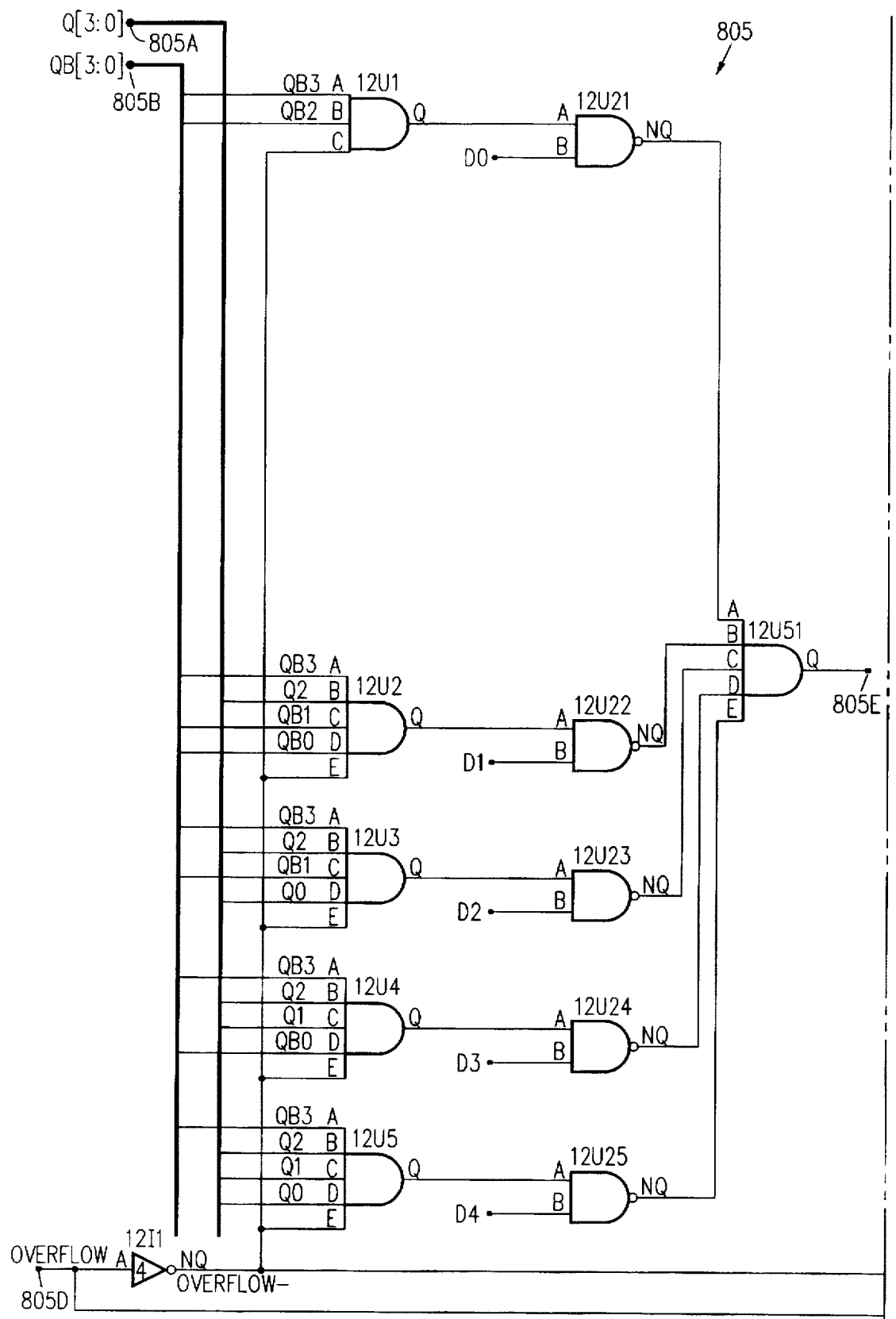
FIGS. 12A and 12B show a gate level schematic of a count decoder and multiplexer circuit according to the second embodiment of the invention shown in FIGS. 8A and 8B.
Figure 12B:
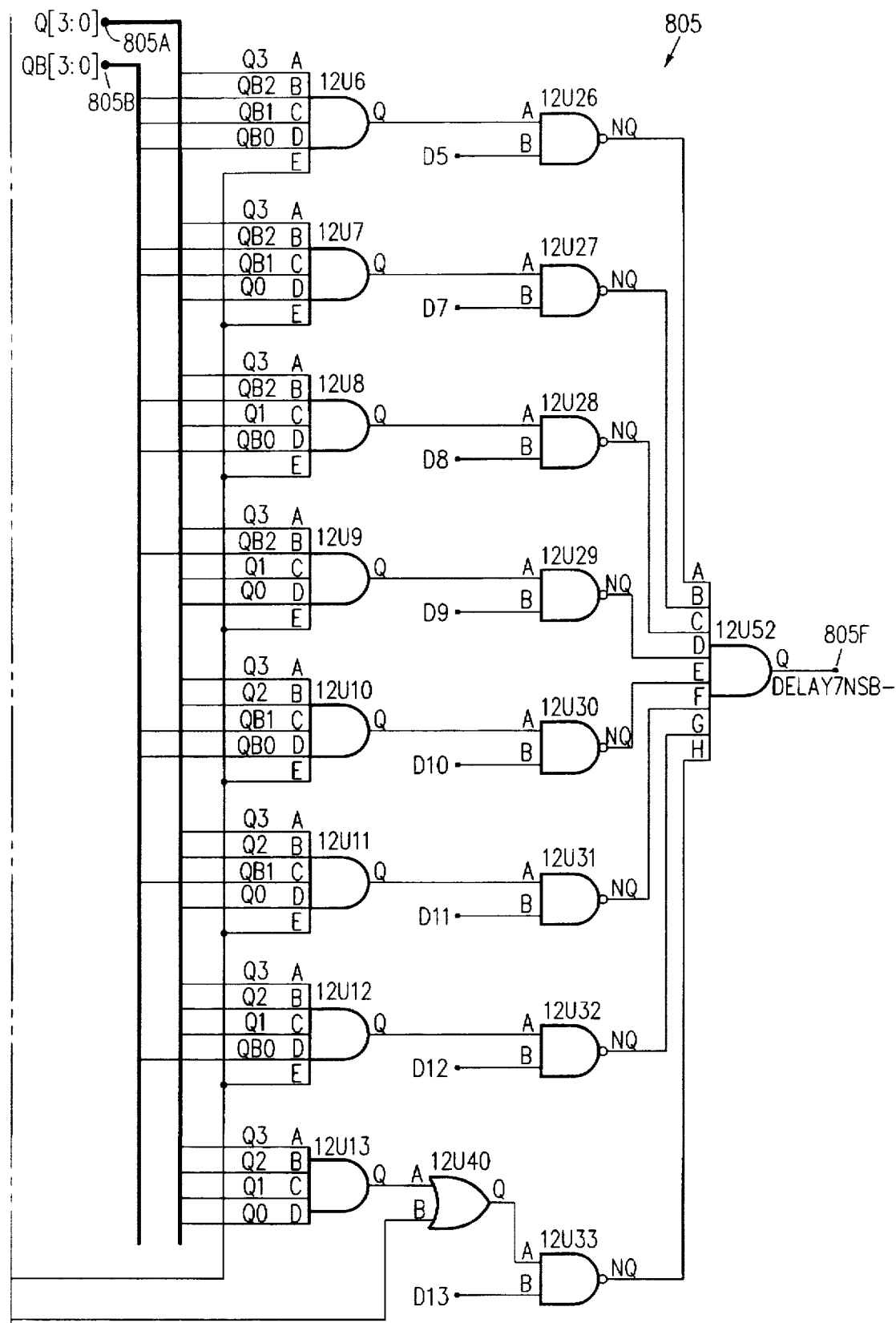
Figures 12C, 12D:
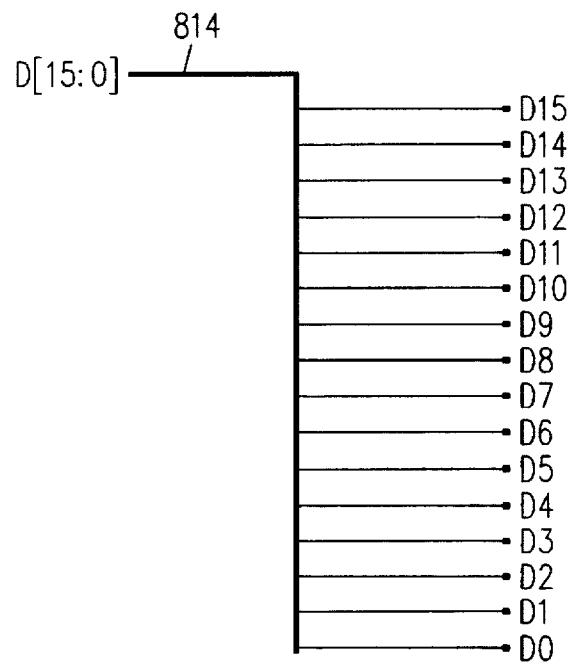

FIG. 12C shows the relationship between a delay taps bus and the delay taps D0 to D15.

FIG. 12D shows the state of the signals on the lines Q0 to Q3 and lines QB0 to QB3 of a count decoder and multiplexer for a count of eight from calibration counter circuit 103.

Figure 8A:
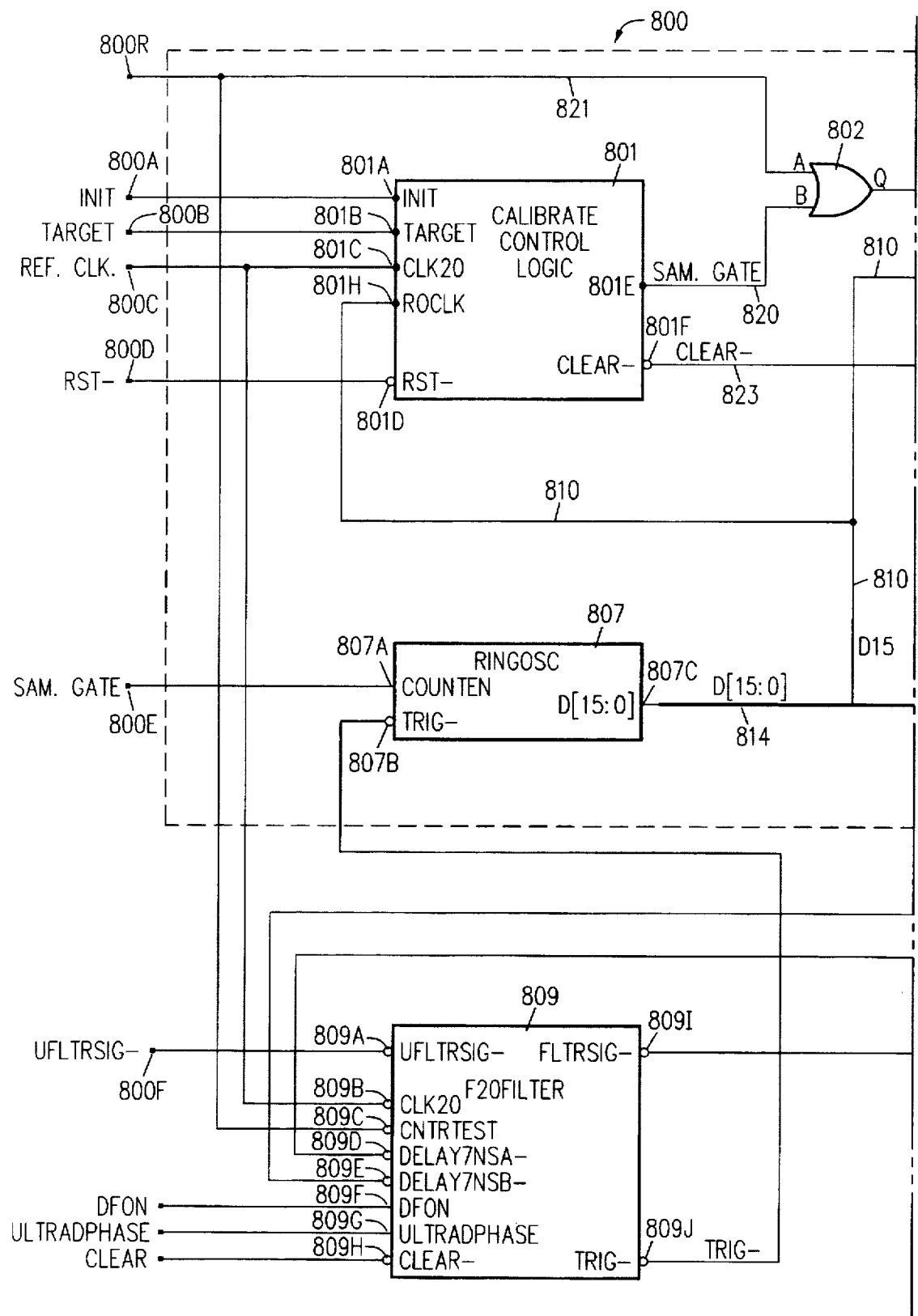
FIGS. 8A and 8B show a second embodiment of a digital delay circuit according to the invention.
Figure 8B:
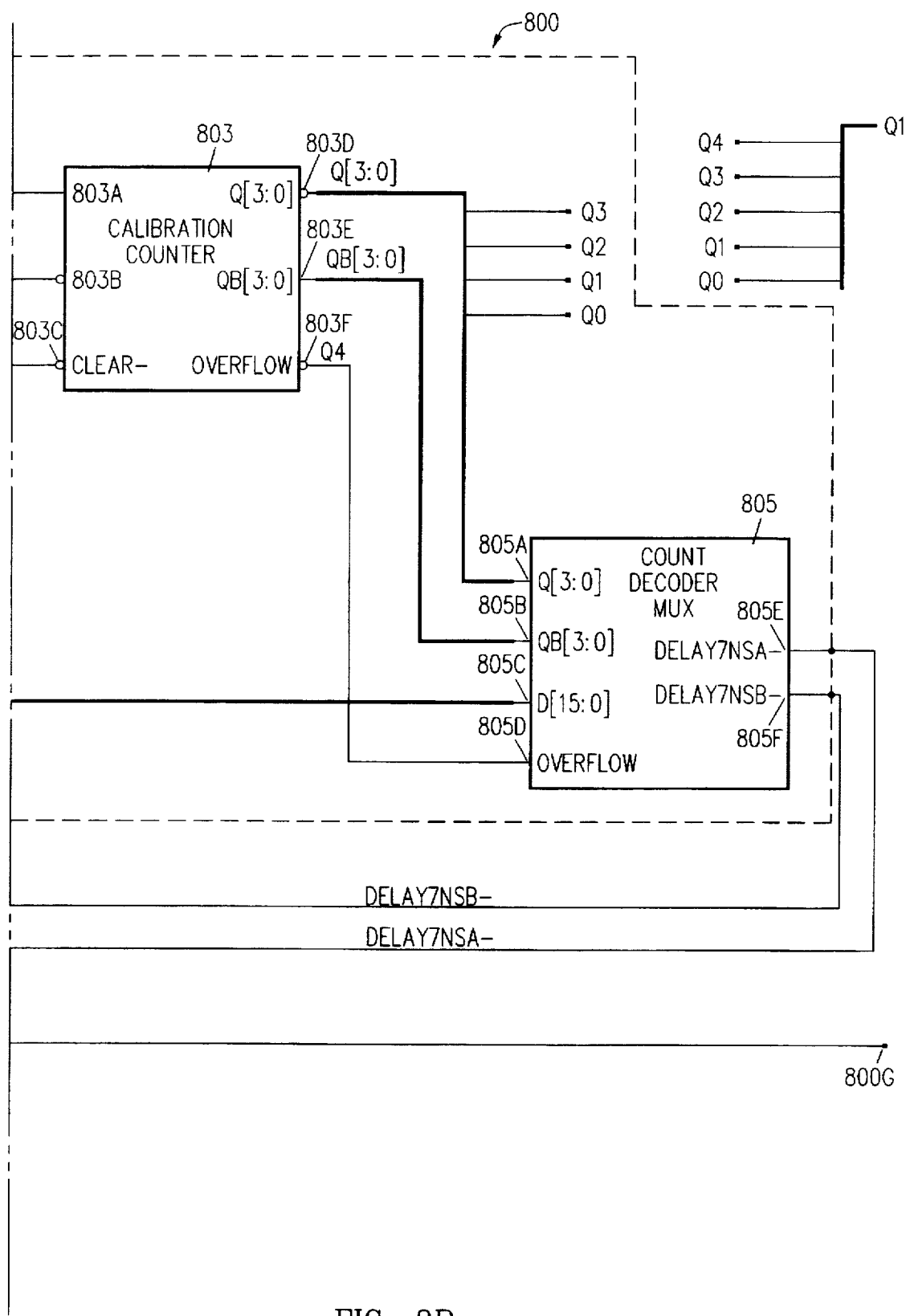
Figure 13:
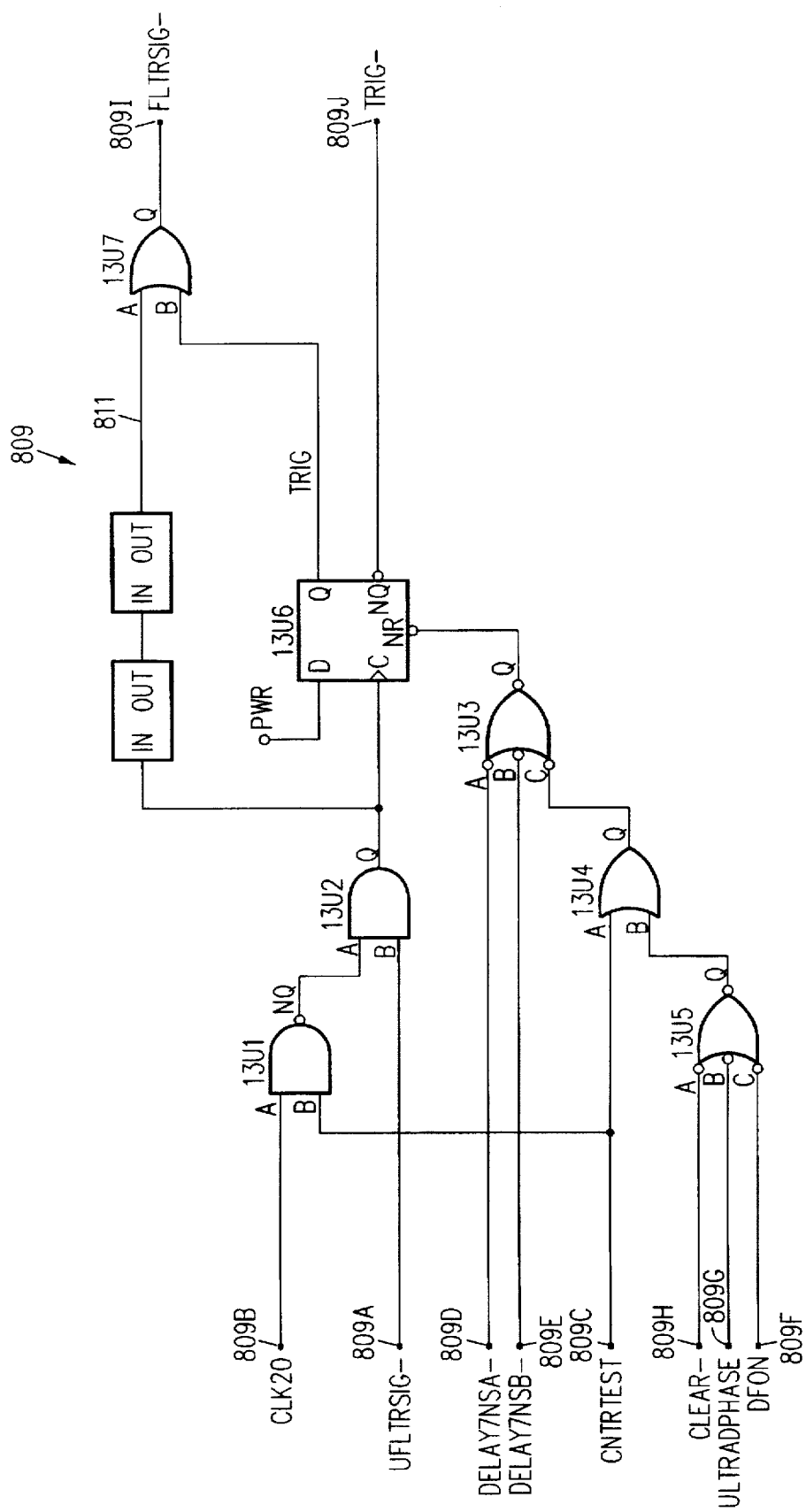

FIG. 13 shows one embodiment of a filter circuit used with the second embodiment of the invention shown in FIGS. 8A and 8B.

Figure 14:
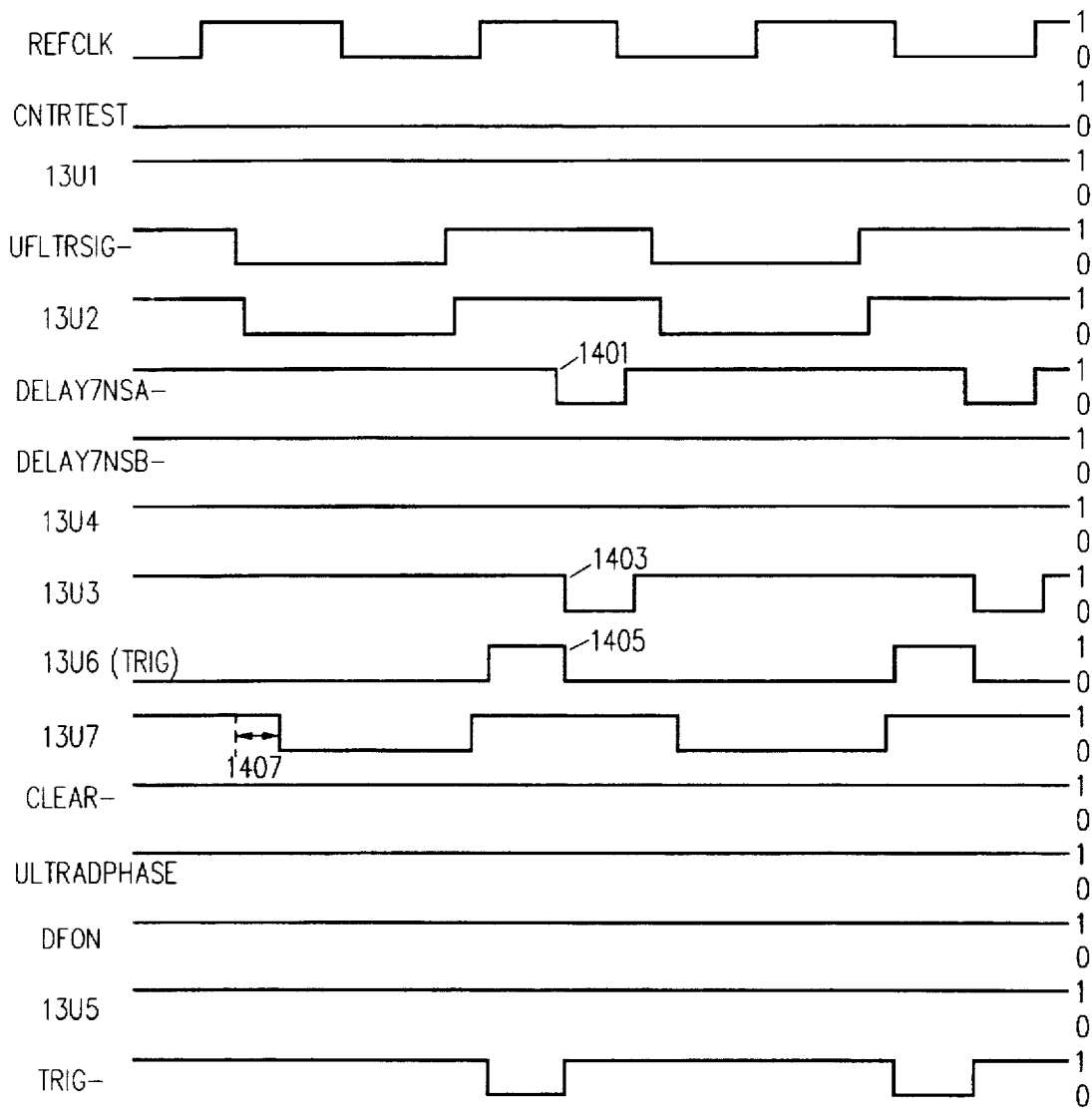

FIG. 14 is a signal diagram for the filter circuit shown in FIG. 13.

DETAILED DESCRIPTION

According to the principles of this invention, a digital delay circuit includes only standard digital circuit components. Therefore, the prior art problems associated with analog delay components have been eliminated. Since only standard digital components are used, digital delay circuits 100 (FIG. 1A) and 800 (FIGS. 8A and 8B) can be used with any standard semiconductor technology and no post fabrication processing, such as laser trimming, is required. Consequently, digital delay circuits 100 and 800 can be easily utilized in a wide variety of applications.

Digital delay circuits 100 and 800 can produce relatively short signal delay times without requiring a special high frequency clock. Further, digital delay circuits 100 and 800 generate delay times which have a delay time accuracy within about plus or minus two inverter delays. Digital delay circuits 100 and 800 are suitable for use in deglitching filters, data separators, or any other circuitry which requires a signal delay time more accurate than can be provided by a simple inverter chain.

Another important feature of this invention, is that the delay time associated with the digital delay circuit of this invention is changed to compensate for operating and process conditions. In response to a calibration signal, digital delay circuits 100 and 800 enter an auto-calibration mode. In the auto-calibration mode of operation, digital delay circuits 100 and 800 automatically compensate for time delay variations caused by process extremes, temperature changes, and average voltage changes.

When the calibration signal goes to a second state, i.e., an active state, digital delay circuit 100 operates in the auto-calibration mode. In the auto-calibration mode, digital delay circuit 100 adjusts, and selects the signal delay time imposed on an input signal.

When digital delay circuit 100 receives a calibration signal having a first state, i.e., an inactive state, digital delay circuit 100 operates as a delay circuit. An input signal on signal input line 100C to digital delay circuit 100 is passed to output line 100E after a calibrated time delay.

As explained more completely below, in one embodiment, during the auto-calibration mode of operation, an output signal of a delay chain circuit is fed back to the delay chain circuit input line, causing the output signal to oscillate. The oscillations are counted to determine the actual time delay of the individual elements that make up the delay chain circuit. The actual time delay is used to determine what fraction of the same delay chain circuit to use to provide a desired time delay.

When the auto-calibration process is completed, digital delay circuit 100 switches back to the normal delay mode and delays the input signal using the calibrated delay time until the next transition of the calibration signal causes digital delay circuit 100 to automatically re-calibrate the delay time. Thus, according to the principles of this invention, the same components, i.e., the delay chain circuit, are used in both the auto-calibration and normal modes of operation. If the digital delay circuit of this invention is operated in the auto-calibration mode at regular intervals, or prior to delaying a signal, any change in the signal delay time through the delay chain circuit is also present when the delay chain circuit is used to provide the oscillation count. Therefore, any change in the signal delay time is automatically taken into account and canceled out.

Digital delay circuit 100 includes digital calibration circuit 150 that includes a calibrate control logic circuit 101, a calibration counter circuit 103, and a count decoder circuit 105. A digital delay signal generator 175 includes a delay input multiplexer 107, a delay chain circuit 109 and a output signal select circuit 111. While in this embodiment, delay chain circuit 109, sometimes referred to as a digital signal delay chain circuit, is included in digital delay signal generator 175, an important aspect of this invention is that digital signal delay chain circuit 109 is used in both auto-calibration and normal modes of operations of digital delay circuit 100.

Digital delay circuit 100 has four input lines. Digital calibration circuit 150 has a reference clock input terminal 101A that is connected to a reference clock line 100A; a calibration signal input terminal 101B that is connected to a calibration control signal input line 100A; and a reset terminal 101F that is connected to a reset line 100F. Digital delayed signal generator 175 has a signal input terminal 107B connected to a signal input line 100C. Digital delay circuit 100 can also include an optional delay select input bus 100D that is connected to count decoder 105. Digital delay circuit 100 has a single output terminal, i.e., output terminal 111E of digital delayed signal generator 175 that is connected to a delayed signal output line 100E.

Digital delay circuit 100 operates in two modes; an auto-calibration mode and a normal delay mode. As discussed above, in the auto-calibration mode, digital delay circuit 100 automatically calibrates, adjusts, and selects the signal delay time imposed on an input signal on input line 100C. When the auto-calibration process is completed, digital delay circuit 100 switches back to the normal delay mode and delays the input signal by the calibrated delay time determined in the most recent auto-calibration mode. The same calibrated delay time is used until the next transition of the calibrate signal on causes digital delay circuit 100 to return to the auto-calibration mode.

As discussed in more detail below, prior to activation of the auto-calibration mode, an active reset signal RESET is connected to digital delay circuit 100 through reset input line 100F. Digital delay circuit 100 applies active reset signal RESET to calibrate control logic circuit 101 at input terminal 101F, and to calibration counter circuit 103 at input terminal 103B by line 122. Active reset signal RESET shifts the logic elements in calibrate control logic circuit 101 to the reset condition and zeros registers contained in calibration counter circuit 103.

Figure 1A:
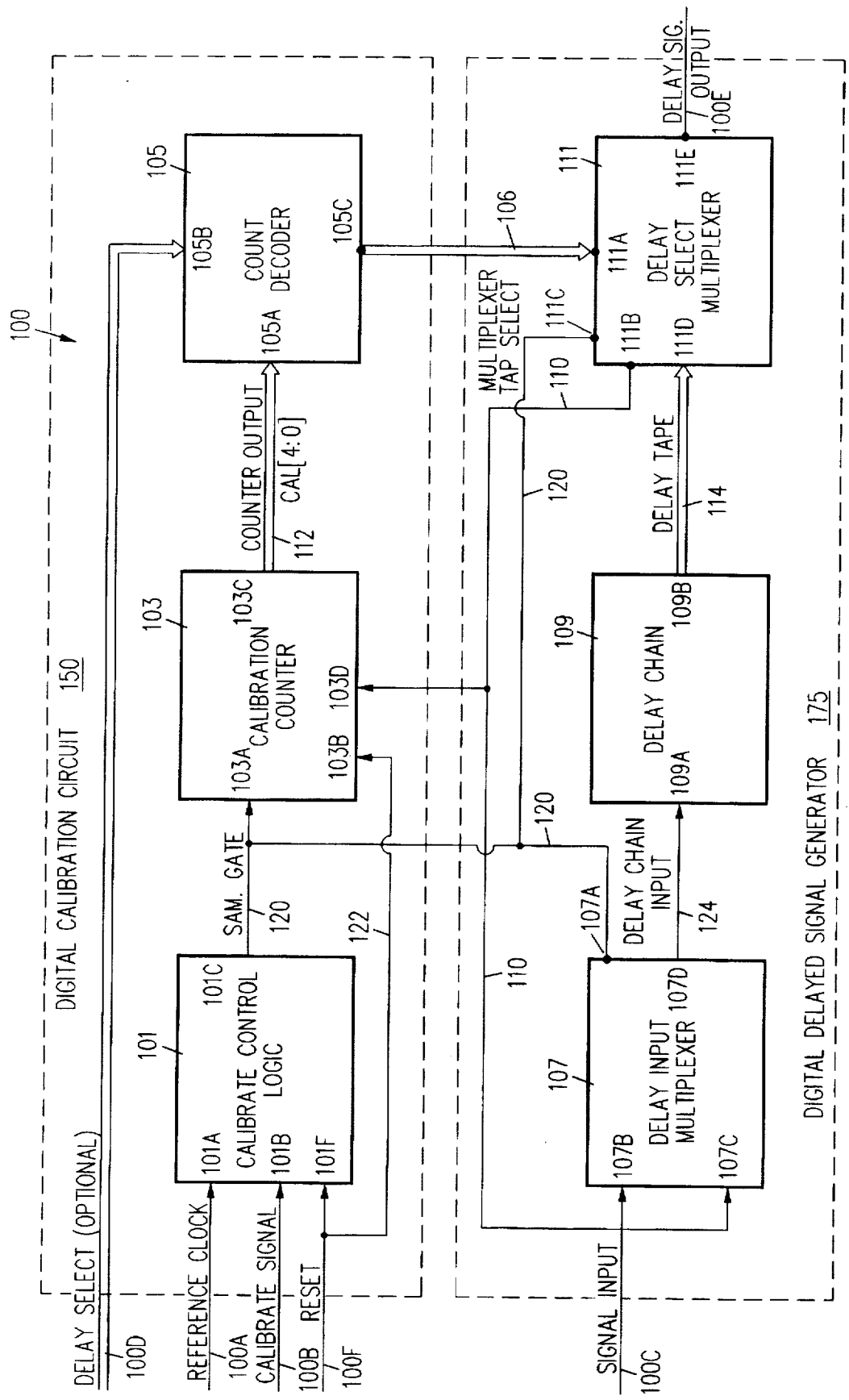
FIG. 1A shows a block diagram of a digital delay circuit in accordance with the invention.
Figure 1B:
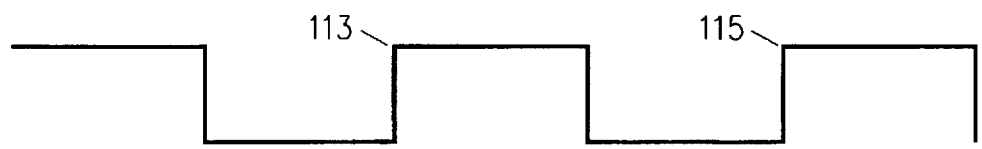
FIG. 1B shows a typical reference clock signal REFCLK including trigger edges 113 and 115.

In the auto-calibration mode of operation, a reference clock signal REFCLK is connected to calibrate control logic circuit 101 through input terminal 101A. FIG. 1B shows a typical reference clock signal REFCLK. The time interval between edges 113 and 115 is used during the calibration period to determine the actual signal time delay of the entire delay chain. In one embodiment of the invention, reference clock signal REFCLK is a 40 MHz clock signal generated by a local oscillator in another portion of the system containing circuit 100. However, reference clock signal REFCLK can be any frequency desired and can be generated by any means which produces a stable input frequency.

Figure 1C:
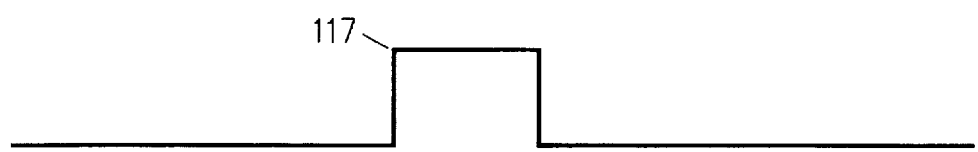
FIG. 1C shows a typical calibrate signal CALSIG including transitional edge 117 according to the invention.

Also, in the auto-calibration mode, a calibrate signal CALSIG, connected to input terminal 101B of calibrate control logic circuit 101, changes state, i.e., transitions from a first state, e.g. an inactive state to a second state, e.g. an active state. A typical calibrate signal CALSIG is shown in FIG. 1C including transitional edge 117 from the first state to the second state.

When calibrate signal CALSIG goes active, calibrate control logic circuit 101 uses reference clock signal REFCLK to generate a sample gate signal SAMGATE at output terminal 101C which is connected to sample gate line 120. A typical sample gate signal SAMGATE is shown in FIG. 1D and includes transitional edges 121 and 123 which represent the transition from the inactive state to the active state, and from the active state to the inactive state, respectively.

Figure 1D:
FIG. 1D shows a typical sample gate signal SAMGATE including transitional edges 121 and 123 according to the invention.

A minimum predetermined time interval that sample gate signal SAMGATE remains in the active state, i.e., the time between points 121 and 123 in FIG. 1D, may be programmable and is determined by the delay accuracy requirements of the designer, i.e., greater accuracy requires a longer predetermined time interval. A typical time interval is eight cycles of reference clock signal REFCLK. Sample gate line 120 is also connected to: calibration counter circuit 103, through input terminal 103A; output signal select circuit 111, through input terminal 111C; and delay input multiplexer 107, through input terminal 107A.

Delay chain circuit 109 receives an input signal on input terminal 109A. At a multiplicity of points in delay chain circuit 109 a line is taken off at a tap. Each tap in delay chain circuit 109 represents a different time delay with a progressively increasing fraction of the total time delay which can be provided by the delay chain circuit 109 being present at each successive tap. Thus, a tap line connected to the first tap in delay chain circuit 109 is the shortest time delay and a tap line connected to the last tap has the longest time delay. The tap lines form delay taps bus 114. Each line in delay taps bus 114 drives a different input terminal in a plurality of input terminals 111D of output signal select circuit 111.

When sample gate signal SAMGATE goes active on terminal 111C of output signal select circuit 111, output signal select circuit 111 couples the signal on the line in delay taps bus 114 which is connected to the last tap in delay chain 109 to output terminal 111B which in turn drives feedback line 110. Feedback line 110 supplies the output signal from output signal select circuit 111 to input terminal 107C of delay input multiplexer 107.

In the auto-calibration mode, i.e., when sample gate signal SAMGATE is in the active state, delay input multiplexer 107 passes the output signal on input terminal 107C therethrough and so couples the signal on feedback line 110 back into delay chain circuit at input terminal 109A. This feedback signal causes the delay chain circuit output signal to oscillate.

Figure 1E:
FIG. 1E shows a typical oscillating output signal generated by a delay chain circuit according to the invention when the digital delay circuit is in the auto-calibration mode.

The signal on feedback line 110, including the oscillations introduced by delay chain circuit 109, is also connected to calibration counter circuit 103 through input terminal 103D. FIG. 1E shows a typical signal on feedback line 110 when sample gate signal SAMGATE is active and the output signal is oscillating. The presence of the active sample gate signal SAMGATE at terminal 103A of calibration counter circuit 103 starts calibration counter circuit 103 counting the number of oscillations of the output signal on feedback line 110.

In one embodiment of the invention, calibration counter circuit 103 is a binary counter. In this embodiment of the invention, calibration counter circuit 103 is wide enough to prevent registers in calibration counter circuit 103 from overflowing during the time interval when sample gate signal SAMGATE is in the second state and the output signal of delay chain circuit 109 is oscillating at the highest frequency possible under the worst conditions of voltage, temperature, and fabrication process variables.

Figure 1F:
FIG. 1F shows the output signal of a calibration counter circuit according to the invention when the digital delay circuit is in the auto-calibration mode.

While sample gate signal SAMGATE is in the active state, and calibration counter circuit 103 is counting the number of oscillations that occur on feedback line 110, calibration counter circuit 103 generates an updated count value/interval signal as shown in FIG. 1F, for each oscillation of the output signal of delay chain circuit 109. When sample gate signal SAMGATE goes back to the inactive state, the count in calibration counter circuit 103 is inversely proportional to the signal delay time through delay chain circuit 109. The calibration counter output signals from output terminals 103C of calibration counter circuit 103 are driven over counter output bus 112 to input terminals 105A of count decoder circuit 105.

As discussed in more detail below, count decoder circuit 105 generates tap select signals on output bus terminals 105C that are connected to tap select bus 106. Count decoder circuit 105 uses internal logic based upon the count received from bus 112 to determine which signal (only one signal is driven active in this example) to drive active on tap select bus 106. Output signal select circuit 111, sometimes referred to as an output signal selector passes one signal on delay taps bus 114 therethrough to the delayed signal output terminal 100E in response to the signals on tap select bus 106. Thus, the signals from digital calibration circuit 150 on tap select bus 106 select a particular signal delay time in delay chain circuit 109.

In one embodiment of the invention, the tap select signals generated during the auto-calibration mode of operation are latched or stored in output signal select circuit 111 when sample gate signal SAMGATE goes inactive. Thus, the signals are retained in the logic of output signal select circuit 111 until the next auto-calibration mode operation is completed. Consequently, output signal select circuit 111 stores the signals that select a particular signal time delay based on the most recent auto-calibration mode information.

As discussed above, count decoder circuit 105 also includes optional delay select input terminals 105B that are connected to the lines in delay select bus 100D. When incorporated, the delay select input signal is a bias signal which causes the logic in count decoder circuit 105 to process the information on counter output bus 112 according to another logic scheme. This logic scheme provides different tap select signals corresponding to a different set of desired signal delay times.

Once the auto-calibration mode discussed above is completed, i.e., sample gate signal SAMGATE goes inactive, digital delay circuit 100 switches to normal delay operation. Specifically, when sample gate signal SAMGATE on line 120 goes inactive, delay input multiplexer 107 passes input signal SIGIN on input line 100C of digital delay circuit 100 therethrough to delay chain input line 124. Thus, the signal on line 120 to delay input multiplexer 107 is an input select signal. The signal on delay chain input line 124 propagates through delay chain circuit 109. As the signal reaches each tap in delay chain circuit 109, the signal is driven on the corresponding line in delay taps bus 114 to one of a plurality of input terminals 111D of output signal select circuit 111.

In one embodiment of the invention, delay chain circuit 109 is a string of inverters connected in series and the taps are located at predetermined locations in the string of inverters. The total signal delay time of delay chain circuit 109 must be at least equal to the desired delay time of digital delay circuit 100 under all expected operating conditions. The number and location of the taps in delay chain circuit 109 is determined by the desired range of delay times, the individual inverter propagation delays, and the desired accuracy.

As discussed above, in one embodiment of the invention, the tap select signals generated during the auto-calibration mode of operation are latched in the logic of output signal select circuit 111. Thus, output signal select circuit 111 passes therethrough the signal on the line in delay taps bus 114 that corresponds to the desired time delay and includes compensation for process variations, temperature, and voltage variations.

Figure 2A:
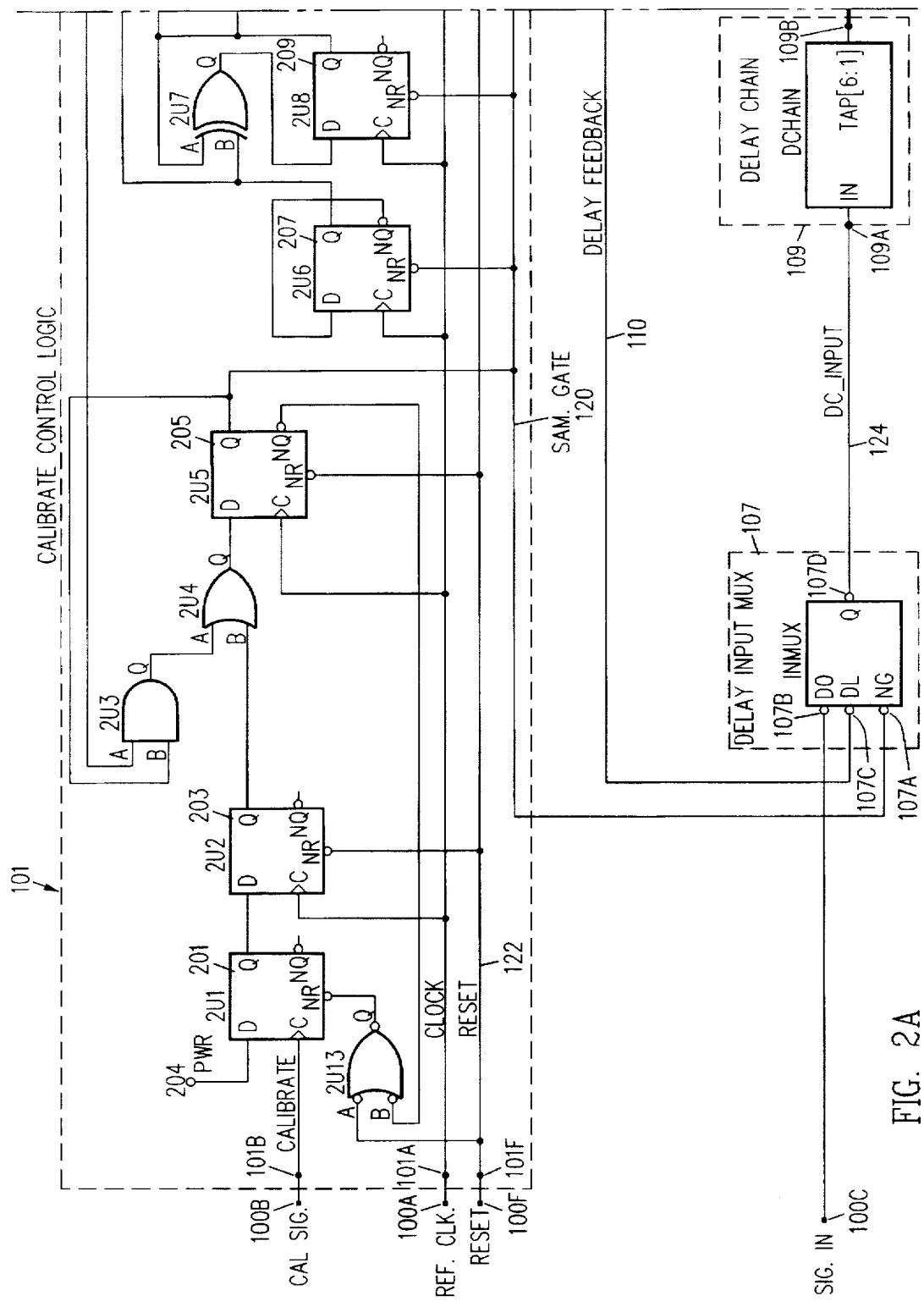
FIGS. 2A and 2B show a schematic diagram of one embodiment of a digital delay circuit according to the invention which includes a gate level schematic of the calibration control logic circuit.

FIGS. 2A to 7 are detailed schematic diagrams of a first embodiment of a digital delay circuit 100. FIGS. 2A and 2B are a schematic diagram of a first embodiment of a digital delay circuit 100 including a gate level schematic diagram of the circuitry in calibrate control logic circuit 101 (FIG. 1A).

Figure 2B:
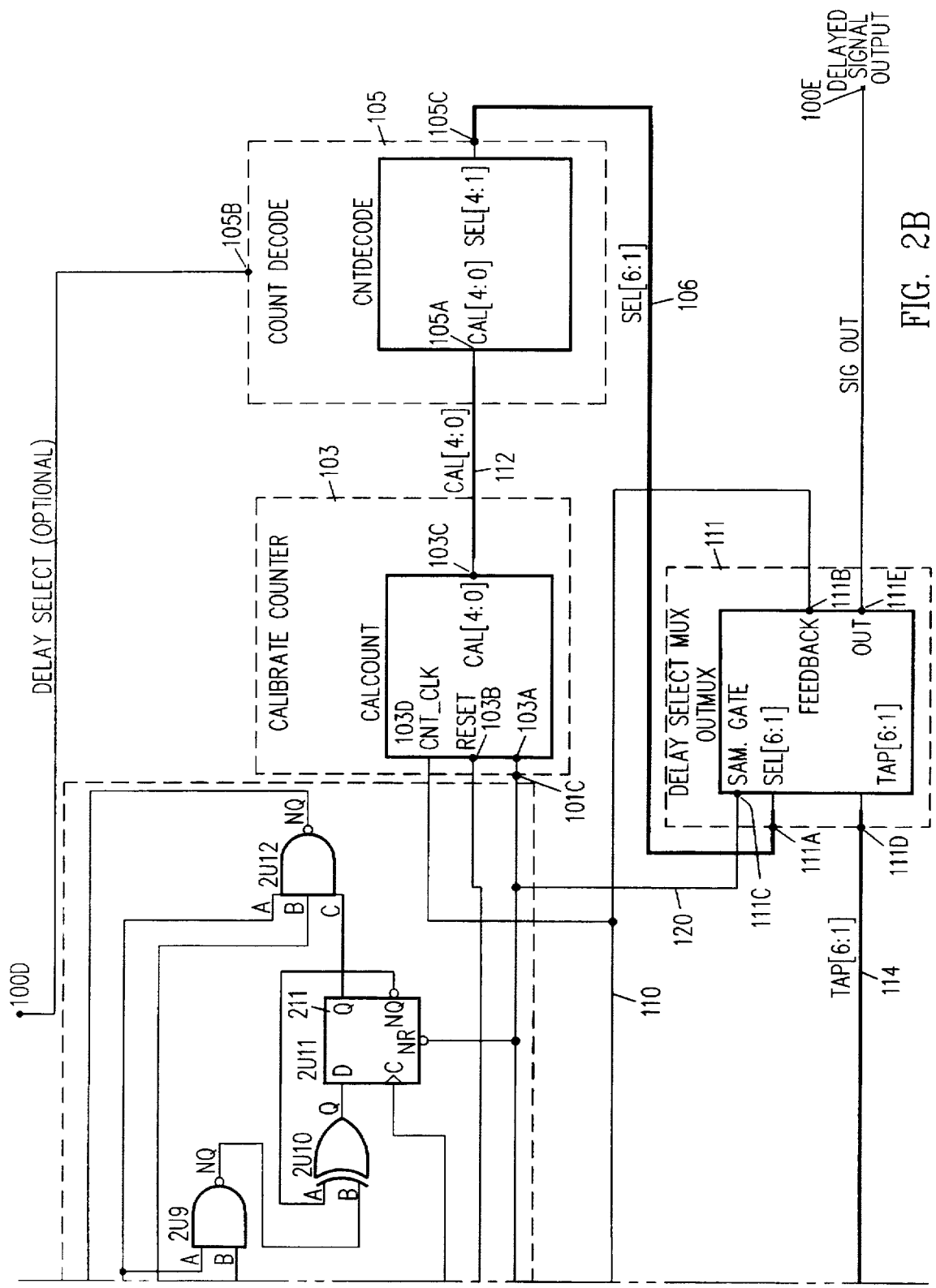
Figure 3:
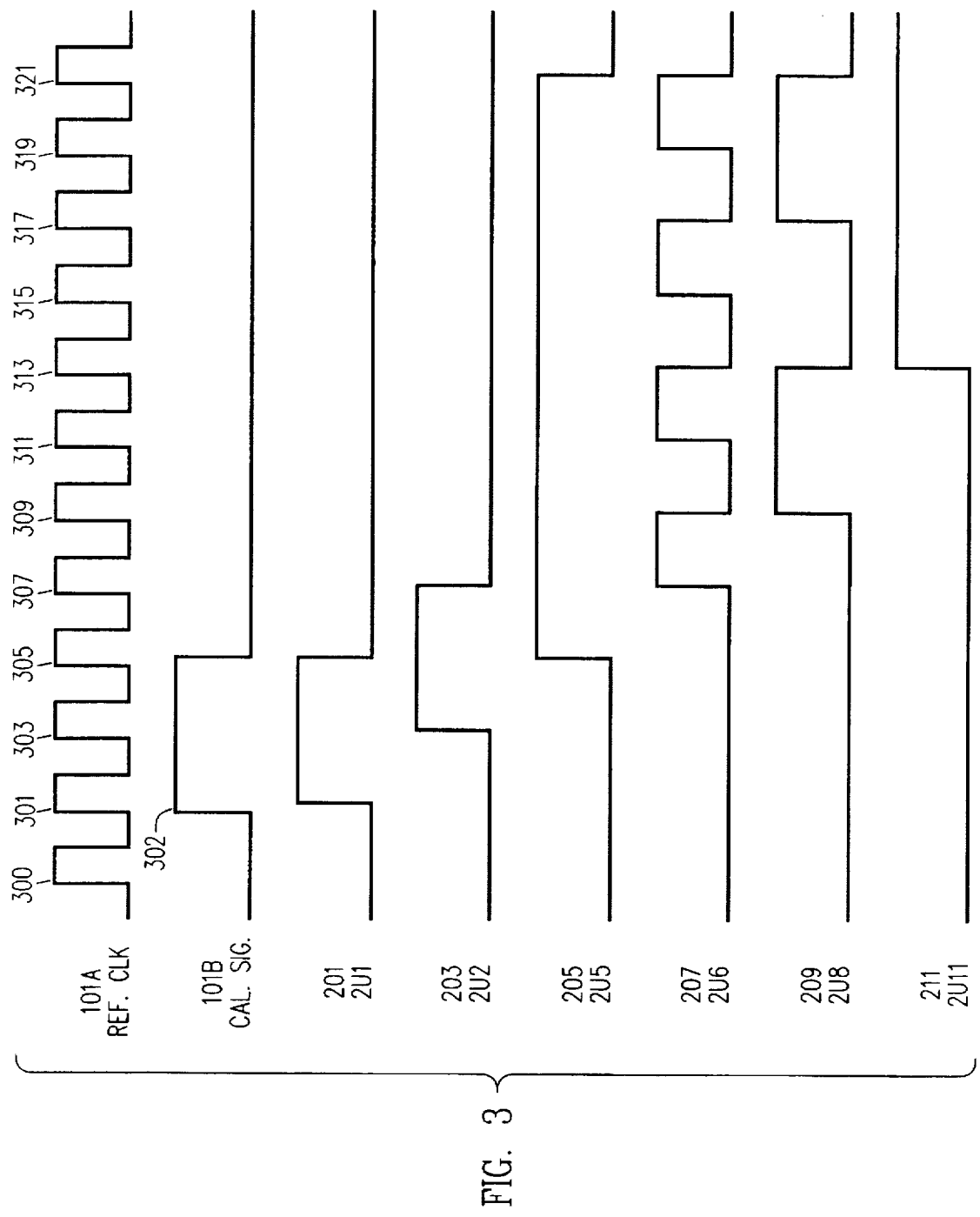
FIG. 3 shows a signal diagram for the embodiment of the calibration control logic circuit shown in FIGS. 2A and 2B.

FIG. 3 is a signal diagram for the embodiment of the circuitry in calibrate control logic circuit 101 shown in FIGS. 2A and 2B. The signals shown in FIG. 3 represent the signals at terminals with the same reference numeral in FIGS. 2A and 2B. The signals shown in FIG. 3 are synchronized to reference clock signal REFCLK and include small delays due to the internal propagation delays of the elements, i.e., gate delays.

The operation of this embodiment of the circuitry of calibrate control logic circuit 101 is described with reference to FIGS. 2A, 2B, and 3. In the following discussion, a terminal in a low state is defined as a terminal having a logic zero (0) signal present, and a terminal in a high state is defined as a terminal having a logic one (1) signal present.

Prior to the application of calibrate signal CALSIG to clock terminal C of D-type flip-flop 2U1, digital delay circuit 100 typically receives an active reset signal RESET at input terminal 101F. Active reset signal RESET is applied to reset terminals NR of D-type flip-flops 2U2, and 2U5. Thus, output terminals Q of D-type flip-flops 2U2 and 2U5 are driven low which in turn results in the output signal on output terminal NQ of NAND gate 2U12 going high.

Thus, the output signal of NAND gate 2U12 is high. The high output signal of NAND gate 2U12 drives input terminal A of AND gate 2U3 high. However, the second input terminal B of AND gate 2U3 is driven low by the low signal from output terminal Q of D-type flip-flop 2U5, hereafter flip-flop 2U5. Thus, AND gate 2U3 drives the first input terminal A of OR gate 2U4 low. The second input terminal B of OR gate 2U4 is driven low by the low signal from output terminal Q of flip-flop 2U2. Therefore, OR gate 2U4 drives input terminal D of flip-flop 2U5 low. Active reset signal RESET also drives a first input terminal A of AND gate 2U13 low and the low output signal from AND gate 2U13 drives the reset terminal NR of D-type flip-flop 2U1, hereafter flip-flop 2U1, low. Therefore, output terminal Q of flip-flop 2U1 is also driven low. Output terminal Q of flip-flop 2U1 is connected to input terminal D of D-type flip-flop 2U2, hereafter flip-flop 2U2. The various flip-flops remain in the reset state until an active calibration signal CALSIG is received on clock input terminal C of flip-flop 2U1.

As calibrate signal CALSIG goes active, the rising trigger edge 302 on clock input terminal C of flip-flop 2U1 (see FIG. 3) clocks the logic one signal on input terminal D of flip-flop 2U1, which drives output terminal Q of flip-flop 2U1 and input terminal D of flip-flop 2U2 high. The high signal at output terminal Q of flip-flop 2U2 in response to reference clock edge 303 drives input terminal B of OR gate 2U4 (see FIG. 2A). A second input terminal A of OR gate 2U4 is connected to output terminal Q of AND gate 2U3. However, irrespective of the output signal of AND gate 2U3, OR gate 2U4 passes the high signal from flip-flop 2U2 to input terminal D of flip-flop 2U5.

Upon application of trigger edge 305 to input terminal 101A (see FIG. 3), output terminal Q of flip-flop 2U5 is driven high and output terminal NQ is driven low. The signal at output terminal Q of flip-flop 2U5 is connected to input terminal B of AND gate 2U3 (see FIG. 2A). Input terminal A of AND gate 2U3 is connected to output terminal NQ of NAND gate 2U12 (see FIG. 2B) which, as discussed above, was driven high by the application of the active reset signal RESET. Therefore, input terminals A and B of AND gate 2U3 are both driven high, and output terminal Q of AND gate 2U3 is driven high. The signal at output terminal Q of AND gate 2U3 is connected to input terminal A of OR gate 2U4. Thus, the signal at output terminal Q of OR gate 2U4 remains high.

The signal on output terminal NQ of flip-flop 2U5 is connected to input terminal B of AND gate 2U13. Consequently, output terminal Q of AND gate 2U13 is driven low. Output terminal Q of AND gate 2U13 is connected to input terminal NR of flip-flop 2U1. Therefore, the low output signal from AND gate 2U13 re-sets flip-flop 2U1 and output terminal Q of flip-flop 2U1 is driven low. Therefore, a low signal is connected to input terminal D of flip-flop 2U2 awaiting the next reference clock trigger edge 307 (see FIG. 3).

The active signal at output terminal Q of flip-flop 2U5 is connected to sample gate line 120 (see FIG. 2A). As discussed above, when sample gate signal SAMGATE goes active on terminal 111C of output signal select circuit 111, output signal select circuit 111 couples the signal on the line in delay taps bus 114 connected to the last tap in delay chain 109 to feedback output terminal 111B which in turn drives feedback line 110. Feedback line 110 couples the output signal from output terminal 111B of output signal select circuit 111 to input terminal 107C of delay input multiplexer 107.

Delay input multiplexer 107 passes the output signal on input terminal 107C therethrough when sample gate signal SAMGATE is active and so couples the signal on feedback line 110 back into delay chain circuit 109 at input terminal 109A. This feedback signal causes the output signal of delay chain circuit 109 to oscillate.

The presence of an active sample gate signal SAMGATE at terminal 103A of calibration counter circuit 103 starts calibration counter circuit 103 counting the number of oscillations of the output signal of delay chain circuit 109 that occur on delay feedback line 110.

The signal at output terminal Q of flip-flop 2U5 is also connected by sample gate line 120 (see FIG. 2A) to the reset input terminals NR of flip-flops 2U6, 2U8 and 2U11 (see FIGS. 2A and 2B). Thus, the active signal on output terminal Q of flip-flop 2U5 takes flip-flops 2U6, 2U8, and 2U11 out of reset. When flip-flop 2U6 is taken out of reset, output terminal NQ of flip-flop 2U6, which is connected to input terminal D of flip-flop 2U6, is high (see FIGS. 2A and 3).

Recall that the active signal from flip-flop 2U5 resets flip-flop 2U1. Thus, as trigger edge 307 rises on input terminal 101A (see FIG. 3), output terminal Q of flip-flop 2U2 is driven low, which in turn drives input terminal B of OR gate 2U4 low (see FIG. 2A). However, the signal at output terminal Q of OR gate 2U4 remains high, driving output terminal Q of flip-flop 2U5 high, until output terminal Q of AND gate 2U3 is driven low.

Trigger edge 307 also drives output terminal Q of flip-flop 2U6 high and output terminal NQ of flip-flop 2U6 low. Therefore, a low signal is connected to input terminal D of flip-flop 2U6 awaiting application of the next trigger edge 309 (see FIG. 3).

The active signal on output terminal Q of flip-flop 2U6 in response to trigger edge 307 is connected to input terminal B of XOR gate 2U7, input terminal A of NAND gate 2U9, and input terminal A of NAND gate 2U12 (see FIGS. 2A and 2B). The low signal on output terminal Q of flip-flop 2U8 is connected to input terminal A of XOR gate 2U7 and input terminal B of NAND gate 2U9. Therefore, output terminal Q of XOR gate 2U7 is driven high which in turn drives input terminal D of flip-flop 2U8 high. Output terminal NQ of NAND gate 2U9 is driven high which in turn drives input terminal B of XOR gate 2U10 high. Input terminal A of XOR gate 2U10 is connected to output terminal NQ of flip-flop 2U11 and so output terminal NQ of flip-flop 2U11 is also driven high. Therefore, output terminal Q of XOR gate 2U10 is driven low.

As trigger edge 309 rises on input terminal 101A (see FIG. 3), output terminal Q of flip-flop 2U6 is driven low; output terminal Q of flip-flop 2U8 is driven high; and output terminal Q of flip-flop 2U11 is driven low (see FIGS. 2A and 2B). Thus, the signal on input terminal B of XOR gate 2U7 is low and the input signal on input terminal A is high. Consequently, output terminal Q of XOR gate 2U7 is driven high which in turn drives input terminal D of flip-flop 2U8 high. NAND gate 2U9 has a low input signal and a high input signal. Thus, output terminal NQ of NAND gate 2U9 is driven high which in turn drives input terminal B of XOR gate 2U10 high. Input terminal A of XOR gate 2U10 is high and so output terminal Q of XOR gate 2U10 remains low as does input terminal D of flip-flop 2U11.

As trigger edge 311 rises on input terminal 101A (see FIG. 3), output terminal Q of flip-flop 2U6 is driven high; output terminal Q of flip-flop 2U8 remains high; and output terminal Q of flip-flop 2U11 remains low (see FIGS. 2A and 2B). Thus, the signal on input terminal B of XOR gate 2U7 is high. Therefore, input terminal D of flip-flop 2U8 is driven low and input terminal D of flip-flop 2U11 is driven high.

Thus, as trigger edge 313 rises on terminal 101A (see FIG. 3), output terminal Q of flip-flop 2U6 is driven low; output terminal Q of flip-flop 2U8 is driven low; and output terminal Q of flip-flop 2U11 is driven high (see FIGS. 2A and 2B). Consequently, input terminal B of XOR gate 2U10 is driven low, and input terminal D of flip-flop 2U11 is driven high.

When trigger edge 315 rises on input terminal 101A (see FIG. 3), output terminal Q of flip-flop 2U6 is driven high; output terminal Q of flip-flop 2U8 remains low; and output terminal Q of flip-flop 2U11 remains high (see FIGS. 2A and 2B). Consequently, input terminal B of XOR gate 2U10 is driven low, and output terminal Q of flip-flop 2U10 remains high.

When trigger edge 317 rises on input terminal 101A (see FIG. 3), output terminal Q of flip-flop 2U6 is driven low; output terminal Q of flip-flop 2U8 is driven high; and output terminal Q of flip-flop 2U11 remains high (see FIGS. 2A and 2B). Consequently, the signal at input terminal D of flip-flop

11

2U8 remains high, the signal at input terminal B of XOR gate 2U10 remains high, and the signal at input terminal D of flip-flop 2U11 remains high.

When trigger edge 319 rises on input terminal 101A (see FIG. 3), output terminal Q of flip-flop 2U6 is driven high; output terminal Q of flip-flop 2U8 remains high; and output terminal Q of flip-flop 2U11 remains high (see FIGS. 2A and 2B). The high signal at output terminal Q of flip-flop 2U6 is connected to input terminal A of NAND gate 2U12, the high signal at output terminal Q of flip-flop 2U8 is connected to input terminal B of NAND gate 2U12, and the high signal at output terminal Q of flip-flop 2U11 is connected to input terminal C of NAND gate 2U12. Consequently, output terminal NQ of NAND gate 2U12 is driven low.

Output terminal NQ of NAND gate 2U12 is connected to input terminal A of AND gate 2U3. Therefore, output terminal Q of AND gate 2U3 drives a low signal on input terminal A of OR gate 2U4. Input terminal B of OR gate 2U4 is also low at this time. Therefore, when output terminal NQ of NAND gate 2U12 is driven low, the signal at output terminal Q of OR gate 2U4 is driven low. The signal at output terminal Q of OR gate 2U4, connected to input terminal D of flip-flop 2U5, is low.

When reference clock signal trigger edge 321 rises on input terminal 101A (see FIG. 3), output terminal Q of flip-flop 2U5 is driven low, i.e., sample gate signal SAM-GATE goes inactive. Signal SAMGATE, which results from the process discussed above, is therefore eight input clock pulses wide.

When sample gate signal SAMGATE is active, i.e., the period between trigger edge 305 and trigger edge 321 (FIG. 3), delay select multiplexer 107 switches to input terminal 107C (see FIG. 1A). The output signals of delay chain circuit 109 at output terminals 109B are connected by delay taps bus 114 to input terminals 111D of output signal select circuit 111. The last output signal of delay chain circuit 109 is then passed through output signal select circuit 111 to feedback output terminal 111B and feedback line 110. Feedback line 110 is connected to input terminal 107C of delay input multiplexer 107. Delay input multiplexer 107 passes the output signal on feedback line 110 back into delay chain circuit 109 at input terminal 109A and this feedback signal on feedback line 110 causes the output signal of delay chain circuit 109 to oscillate.

Calibration counter circuit 103 counts the number of oscillations of the output signal of delay chain circuit 109 which is connected to calibration counter circuit 103 at the count clock input terminal 103D (see FIG. 1A). FIGS. 1D and 1E illustrate the relationship between sample gate signal SAMGATE (FIG. 1D) and the oscillations of the output signal of delay chain circuit 109 (FIG. 1E).

Figure 4A:
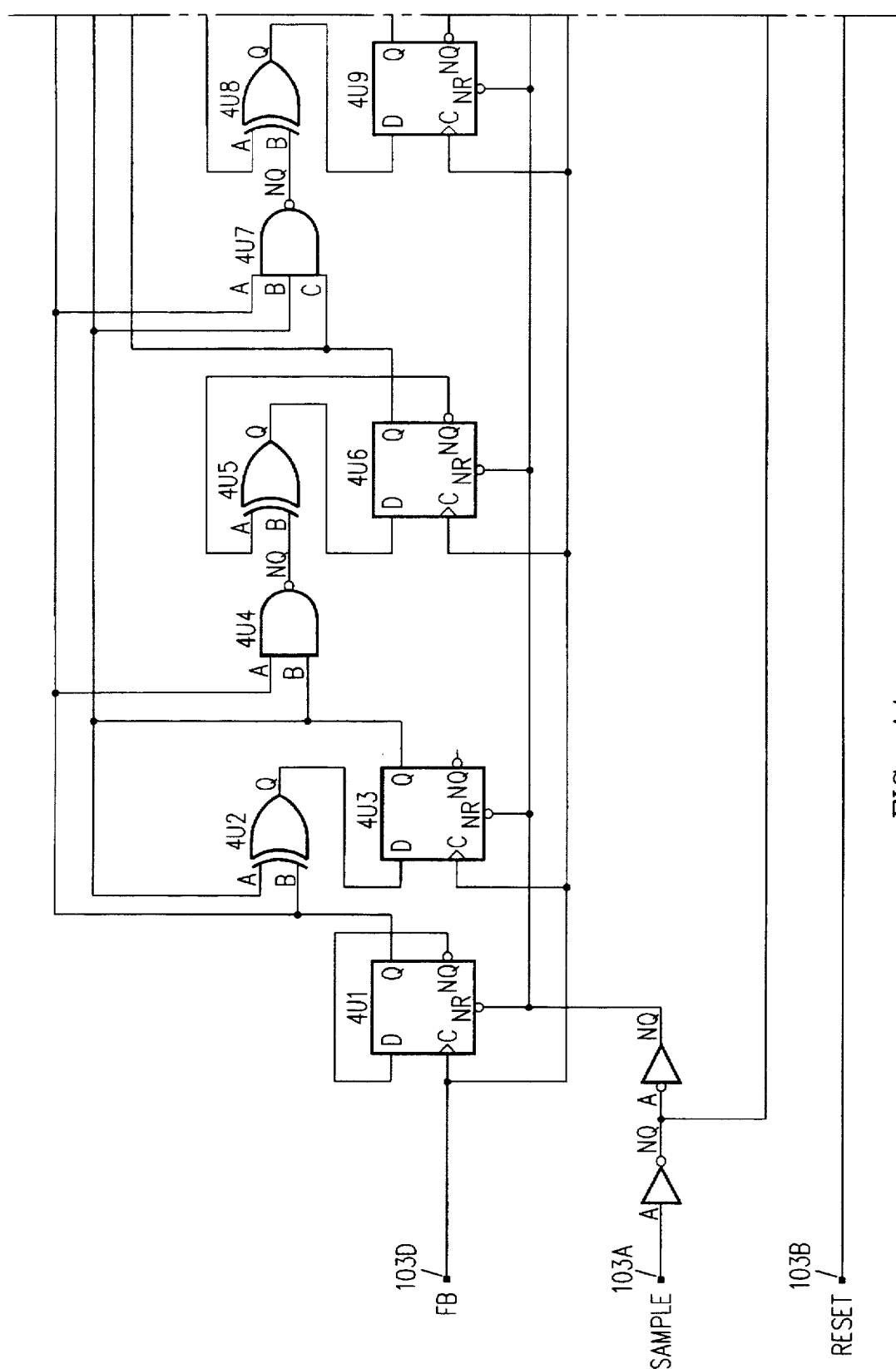
FIGS. 4A and 4B show one embodiment of a calibration counter circuit according to the invention.
Figure 4B:
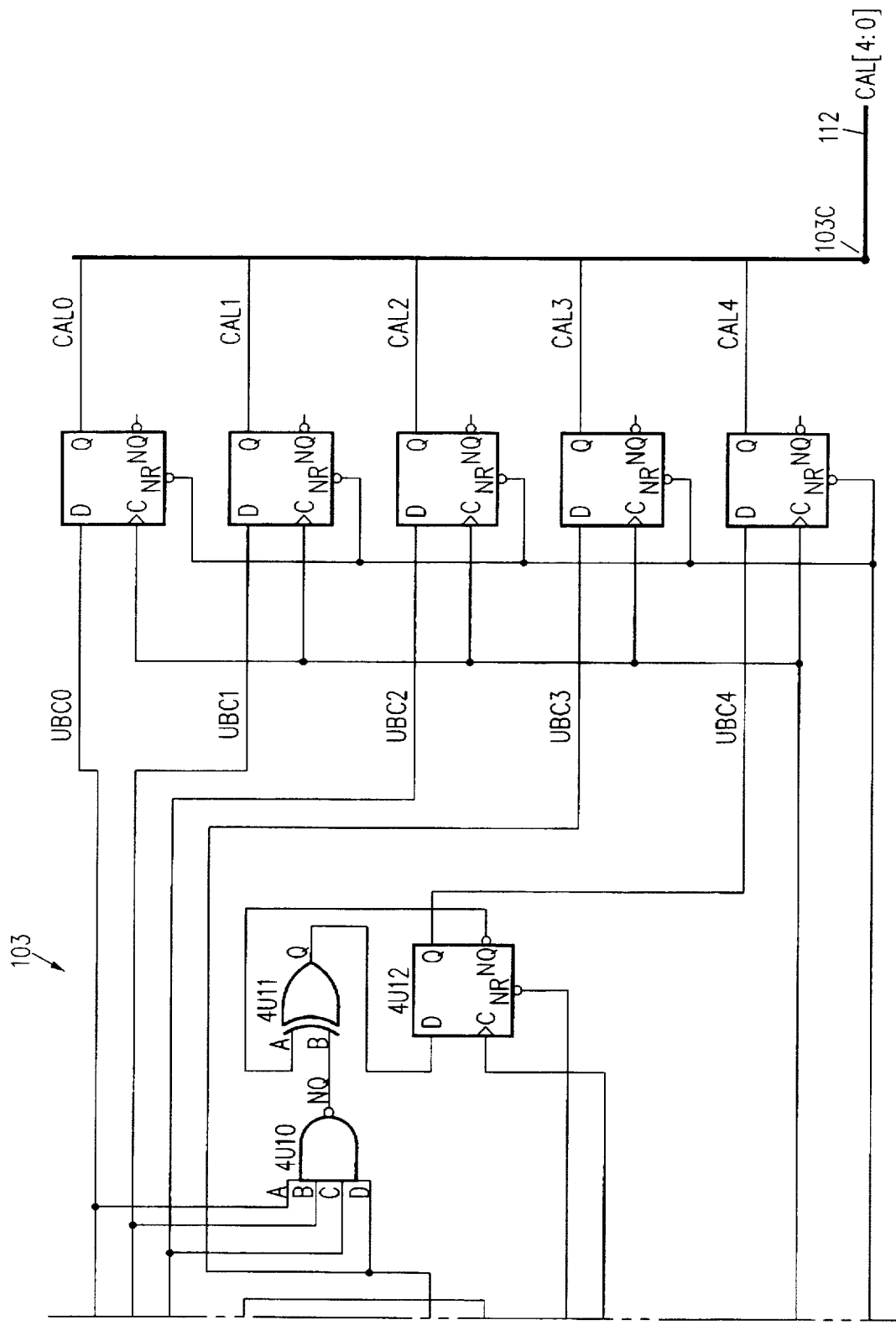

One embodiment of a calibration counter circuit 103 is shown in FIGS. 4A and 4B. In this embodiment of the invention, calibration counter circuit 103 is a binary counter. Calibration counter circuit 103 includes three input terminals: input terminal 103D, which receives the output signal of delay chain circuit 109 on feedback line 110; input terminal 103A, which receives sample gate signal SAM-GATE from line 120; and input terminal 103B, which receives reset signal RESET from line 122 (see FIG. 1A). A counter circuit such as calibration counter circuit 103 is well known to those of skill in the art. Therefore, a detailed description of calibration counter circuit 103 is omitted to avoid detracting from the invention.

Output lines CAL0 to CAL4 of calibration counter circuit 103 (see FIG. 4B) are connected to counter output bus 112.

12

In one embodiment of the invention, a high signal on line CAL0 represents one oscillation of delay chain circuit 109; on line CAL1, two; on line CAL2, four; on line CAL3, eight; and on line CAL4, sixteen.

The binary output signals for counts of 8 to 28 oscillations of delay chain circuit 109 are shown in FIG. 4C. In FIG. 4C, the first column indicates the tap in delay chain circuit 109 which is selected for a given range of counts. In one embodiment of the invention, discussed in more detail below, TAP 1 is selected for a count of 8 to 10, TAP 2 for a count of 11 to 12, TAP 3 for a count of 13 to 15, TAP 4 for a count of 16 to 18, TAP 5 for a count of 19 to 22 and TAP 6 for a count of 23 or more. The count values are shown in column 2. In FIG. 4C, the columns labeled CAL4 to CAL0 show the state of the signal on lines CAL4 to CAL0 associated with each count value. In this embodiment of the invention, a "1" is a signal in the high or active state and a "0" is a signal in the low or inactive state.

Count decoder circuit 105 generates tap select signals on output bus terminals 105C based upon the count received from calibrate counter circuit 103 on bus 112. Counter output bus 112 couples the signals on output lines CAL0 to CAL4 from calibration counter circuit 103 to count decoder circuit 105 at input terminals 105A (see FIG. 1A). Count decoder circuit 105 uses internal logic to process the count on counter output bus 112 to generate an active signal on one of six selection output lines SEL1 to SEL6 in select bus 106.

Figure 5:
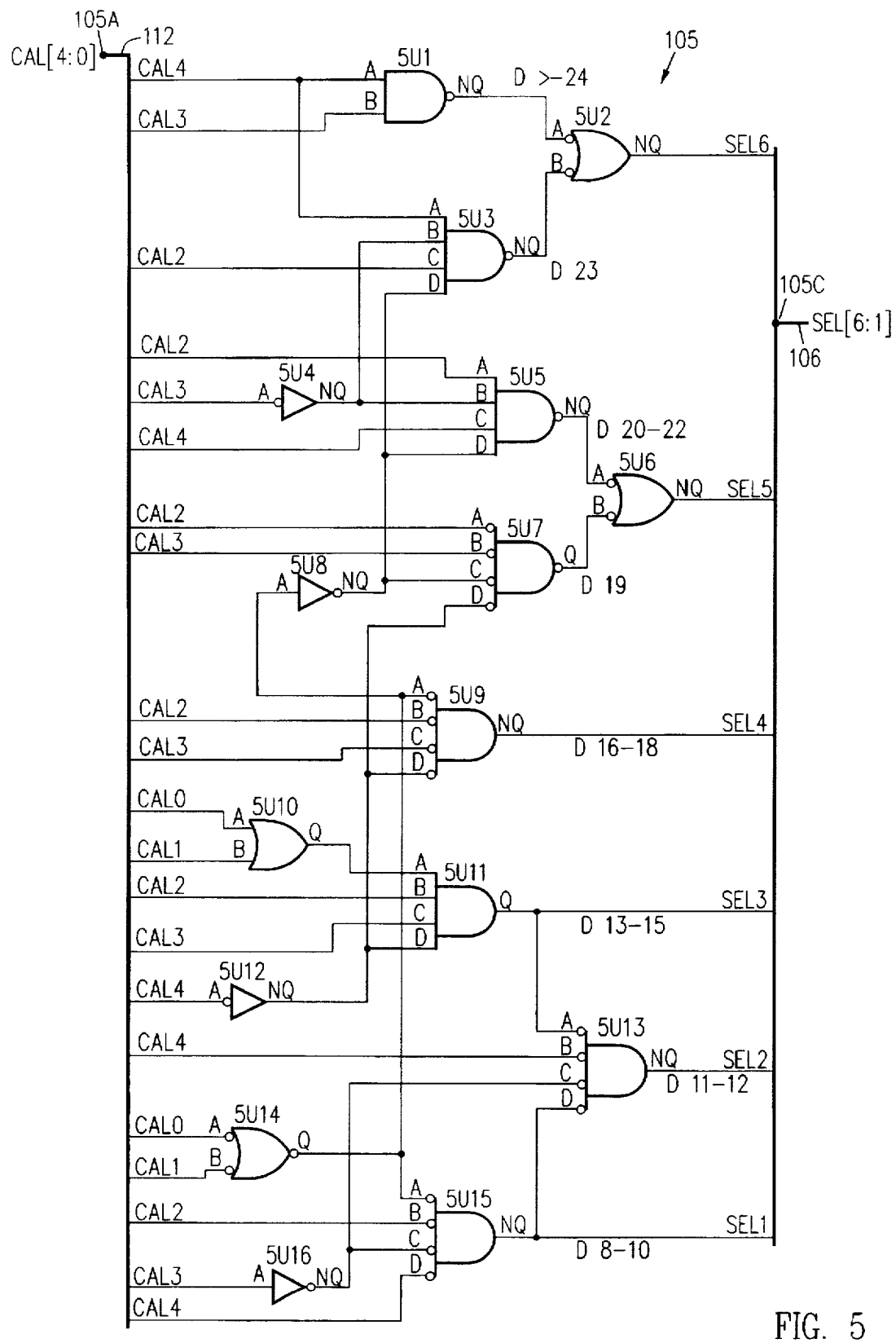
FIG. 5 is a gate level schematic of one embodiment of a count decoder circuit according to the invention.

FIG. 5 shows one embodiment of count decoder circuit 105. Each of lines SEL1 to SEL6 corresponds to a specific range of values from calibration counter circuit 103 at the end of the period when sample gate signal SAMGATE was active. For instance, in the embodiment of count decoder circuit 105 shown in FIG. 5, an active signal on line SEL1 corresponds to a count of 8 to 10. An active signal on line SEL2 corresponds to a count of 11 to 12. An active signal on line SEL3 corresponds to a count of 13 to 15. An active signal on line SEL4 corresponds to a count of 16 to 18. An active signal on line SEL5 corresponds to a count of 19 to 22, and an active signal on line SEL6 corresponds to a count of 23 or greater.

An active signal is generated on line SEL1 when:

$$SEL1 = (\overline{CAL4} \text{ and } CAL3 \text{ and } \overline{CAL2}) \text{ and } (\overline{CAL1} \text{ or } \overline{CAL0}) \quad (1)$$

where:

CALi is the signal on line CALi;

"and" represents a logic AND function;

"or" represents a logic OR function; and a bar over a reference numeral indicates a not.

For example, if the count from calibration counter circuit 103 during the period when sample gate signal SAMGATE is active is nine, the following signals are present on counter output bus 112 and at input terminals 105A of count decoder circuit 105 (see FIG. 4C): signal CAL0 is high; signal CAL1 is low; signal CAL2 is low; signal CAL3 is high; and signal CAL4 is low. (Here, a signal on a line and the line have the same reference numeral for convenience).

This set of signals is processed by count decoder circuit 105 as follows (see FIG. 5): AND gate 5U14 receives a high signal at input terminal A and a low signal at input terminal B. Therefore, output terminal Q of AND gate 5U14 is driven low as is input terminal A of NOR gate 5U15. The signal at input terminal B of NOR gate 5U15 is also driven low, as is the signal at input terminal D of NOR gate 5U15. The signal at input terminal A of inverter 5U16 is driven high which results in the output terminal NQ of inverter 5U16 being driven low. The signal at output terminal NQ of inverter 5U16 is connected to input terminal C of NOR gate 5U15. Therefore, the signal at output terminal NQ of NOR gate 5U15 is driven high. Consequently, the signal on line SEL1 is high. Examination of the circuitry of FIG. 5 shows that the signals on select lines SEL2 to SEL6 are low for this set of signals.

For an input signal at input terminals 105A corresponding to a count of eight or ten, the results described above would similarly result in a high signal at line SEL1 which would be connected to output terminals 105C and bus 106.

An active signal is generated on line SEL2 when:

$$SEL2 = (CAL4 \text{ and } CAL3) \text{ and } (\overline{SEL1} \text{ and } SEL3) \quad (2)$$

For example, if counter 103 counts twelve oscillations of delay chain circuit 109 during the period when sample gate signal SAMGATE is active, the resulting set of signals at input terminals 105A are as follows (see FIG. 4C): signal CAL4 is low; signal CAL3 is high; signal CAL2 is high; signal CAL1 is low; and signal CAL0 is low. This set of signals is processed by the logic of count decoder circuit 105 (see FIG. 5) as follows: Input terminal B of NOR gate 5U13 is driven low. Input terminal A of inverter 5U16 is driven high and therefore output terminal NQ of inverter 5U16 is driven low. The signal at output terminal NQ of inverter 5U16 is connected to input terminal C of NOR gate 5U13. Thus, the output terminal Q of NOR gate 5U15 is driven low and is connected to input terminal D of NOR gate 5U13. The output terminal Q of AND gate 5U11 is driven low and is connected to input terminal A of NOR gate 5U13. Therefore, input terminals A to D of NOR gate 5U13 are all driven low and output terminal NQ of NOR gate 5U13 is driven high. Consequently, the signal on line SEL2 is high. Examination of the circuitry of FIG. 5 shows that the signals on select line SEL1 and select lines SEL3 to SEL6 are low for this set of signals. A similar result is obtained for a count of eleven.

An active signal is generated on line SEL3 when:

$$SEL3 = (\overline{CAL4} \text{ and } CAL3 \text{ and } CAL2) \text{ and } (CAL1 \text{ or } CAL0) \quad (3)$$

For example, if counter 103 counts fourteen oscillations of delay chain circuit 109 while sample gate signal SAMGATE is active, the associated set of signals at input terminals 105A of count decoder circuit 105 is as follows (see FIG. 4C): signal CAL4 is low; signal CAL3 is high; signal CAL2 is high; signal CAL1 is high; and signal CAL0 is low. When this set of signals is connected to input terminals 105A of count decoder circuit 105 (see FIG. 5), the logic in count decoder circuit 105 processes the signals as follows: input terminal A of OR gate 5U10 is driven low and input terminal B of OR gate 5U10 is driven high. Therefore, output terminal Q of OR gate 5U10 is driven high. Input terminal A of AND gate 5U11 is driven high, and so is input terminal B of AND gate 5U11. Input terminal C of AND gate 5U11 is also driven high and input terminal A of inverter 5U12 is driven low. Therefore, the signal at output terminal NQ of inverter 5U12 is high and input terminal D of AND gate 5U11 is also driven high. Therefore, input terminals A to D of AND gate 5U11 are all driven high and the output terminal Q of AND gate 5U11 is driven high. Consequently, the signal on line SEL3 is high. Examination of the circuitry of FIG. 5 shows that the signals on select lines SEL1 to SEL2 and SEL4 to SEL6 are low for this set of signals. A similar result is obtained for a count of thirteen or fifteen.

An active signal is generated on line SEL4 when:

$$SEL4 = (CAL4 \text{ and } \overline{CAL3} \text{ and } \overline{CAL2}) \text{ and } (\overline{CAL1} \text{ or } CAL0) \quad (4)$$

For example, if calibration counter circuit 103 registers a count of seventeen oscillations of delay chain circuit 109 during the period when sample gate signal SAMGATE is active, the following set of signals is generated (see FIG. 4C): signal CAL4 is high; signal CAL3 is low; signal CAL2 is low; signal CAL1 is low, and signal CAL0 is high. This set of signals received at input terminals 105A of count decoder circuit 105 is processed as follows (see FIG. 5): The high signal on line CAL4 is inverted by inverter 5U12 and therefore output terminal NQ of inverter 5U12 is driven low and is connected to input terminal D of NOR gate 5U9. The low signal on signal CAL3 is connected to input terminal C of NOR gate 5U9. The low signal on line CAL2 is connected to input terminal B of NOR gate 5U9 and the high signal on line CAL0 is connected to input terminal A of AND gate 5U14 to be ANDed with the low signal on line CAL1. Therefore, output terminal Q of AND gate 5U14 is driven low and so is input terminal A of NOR gate 5U9. Consequently, the signals at input terminals A to D of NOR gate 5U9 are driven low and the signal at output terminal NQ of NOR gate 5U9 is high and the signal on line SEL4 is high. Examination of the circuitry of FIG. 5 shows that the signals on select lines SEL1 to SEL3 and SEL5 to SEL6 are low for this set of signals. A similar result is obtained for a count of sixteen or eighteen. An active signal is generated on line SEL5 when:

$$SEL5 = (CAL4 \text{ and } \overline{CAL3} \text{ and } \overline{CAL2} \text{ and } CAL1 \text{ and } \quad (5)$$

$$CAL0) \text{ OR } (CAL4 \text{ and } \overline{CAL3} \text{ and } CAL2) \text{ and } (\overline{CAL1} \text{ and } \overline{CAL0})$$

For example, if calibration counter circuit 103 counts nineteen oscillations of delay chain circuit 109 during the period when sample gate signal SAMGATE is active, the set of signals generated by calibration counter circuit 103 is as follows (see FIG. 4C): signal CAL4 is high; signal CAL3 is low; signal CAL2 is low; signal CAL1 is high; and signal CAL0 is high. This set of signals is processed by count decoder circuit 105 as follows (see FIG. 5): The low signal on line CAL2 is connected to input terminal A of NAND gate 5U5 and input terminal A of OR gate 5U7. The low signal on line CAL3 is connected to input terminal A of inverter 5U4, inverted to a high signal at output terminal NQ of inverter 5U4, and connected to input terminal B of NAND gate 5U5. The low signal on line CAL3 is also connected to input terminal B of OR gate 5U7. Accordingly, output terminal NQ of NAND gate 5U5 is driven high and is connected to input terminal A of NAND gate 5U6. The high signal on line CAL4 is connected to input terminal A of inverter 5U12, inverted to a low signal at output terminal NQ of inverter 5U12, and connected to input terminal D of OR gate 5U7. The high signal on line CAL0 is connected to input terminal A of AND gate 5U14, and so is the high signal on line CAL1. Therefore, output terminal Q of AND gate 5U14 is driven high and is connected to input terminal A of inverter 5U8 and inverted to a low signal. The low signal at output terminal NQ of inverter 5U8 is connected to input terminal C of OR gate 5U7, therefore, output terminal Q of OR gate 5U7 is driven low and the output signal of NAND gate 5U6 is high. Consequently, the signal on line SEL5 is high. Examination of the circuitry of FIG. 5 shows that the signals on select lines SEL1 to SEL4 and SEL6 are low for this set of signals. A similar result is obtained for counts of twenty through twenty two.

An active signal is generated on line SEL6 when:

$$SEL6 = \overline{(CAL4 \text{ and } CAL3) \text{ OR}} \tag{6}$$
$$\overline{(CAL4 \text{ and } CAL3 \text{ and } CAL2 \text{ and } CAL1 \text{ and } CAL0)}$$

For example, if calibration counter circuit 103 counts twenty four oscillations of delay chain circuit 109 while sample gate signal SAMGATE is active, the set of signals generated by calibration counter circuit 103 is as follows (see FIG. 4C): signal CAL4 is high; signal CAL3 is high; signal CAL2 is low; signal CAL1 is low; and signal CAL0 is low. When this set of signals is received at input terminals 105A of count decoder circuit 105, it is processed by the logic of count decoder circuit 105 as described below (see FIG. 5). The high signal on line CAL4 is connected to input terminal A of NAND gate 5U1. The high signal on line CAL3 is connected to input terminal B of NAND gate 5U1. Therefore, the output signal of NAND gate 5U1 is low and this signal is connected to input terminal A of NAND gate 5U2. The low signal on line CAL2 is connected to input terminal C of NAND gate 5U3. The high signal on line CAL3 is connected to input terminal A of inverter 5U4, inverted to a low signal and connected to input terminal B of NAND gate 5U3. The low signal on line CAL4 is also connected to input terminal A of NAND gate 5U3. Therefore, the signal at output terminal NQ of NAND gate 5U3 is high and is connected to input terminal B of NAND gate 5U2. Thus, the output signal of NAND gate 5U2 at output terminal NQ is high. Consequently, the signal on line SEL6 is high. Examination of the circuitry of FIG. 5 shows that the signals on select lines SEL1 to SEL5 are low for this set of signals. A similar result is obtained for any count greater than twenty three.

Those of skill in the art will recognize that other embodiments of count decoder circuit 105 can be created using different logic elements and different input signals. Further, the delay counts of 8 to 10 for line SEL1, 11 to 12 for line SEL2, 13 to 15 for line SEL3, 16 to 18 for line SEL4, 19 to 22 for line SEL5, and 23 or greater for line SEL6, are chosen to provide the delay and accuracy desired by the manufacturer.

The logic of count decoder circuit 105 can simply be re-arranged to accommodate new values. However, the delay count ranges are not arbitrarily chosen. For each integrated circuit device, the variations in the fabrication process and changes in temperature and voltage cause the propagation delay of the individual logic gates making up delay chain circuit 109 (see FIG. 1A) to vary over about a 3 to 1 range while the count value in calibration counter circuit 103 is an indicator of the actual element delays at the time the calibrate operation occurs, i.e., while signal SAMGATE is active.

Typically the process variables are fixed within a margin of error at the time the integrated circuit device is manufactured. However, temperature and voltage can vary widely during normal operation. Consequently, the delay count ranges are selected such that for the actual circuit delay, measured while signal SAMGATE is active, count decoder circuit 105 selects the tap on delay taps bus 114 that, under the current condition, provides a signal time delay within the desired range.

Over the full range of conditions, the total signal delay time within the system may change by as much as 300%. However, the present invention provides a signal delay time accurate to within 3% to 10% by selecting the proper delay count ranges.

The signals at output bus terminals 105C of count decoder circuit 105 are connected to select bus 106 which is in turn connected to input terminals 111A of output signal select circuit 111.

When sample gate signal SAMGATE goes back to the inactive state, input multiplexer 107 deselects the feedback signal on input terminal 107C (see FIG. 1A), from delay chain circuit 109 and input multiplexer 107 selects input signal SIGIN on input terminal 107B. This action switches digital delay circuit 100 into normal delay mode. In the normal delay mode, input signal SIGIN is connected to input terminal 109A of delay chain circuit 109 through output terminal 107D of delay input multiplexer 107 and line 124.

Figure 6A:
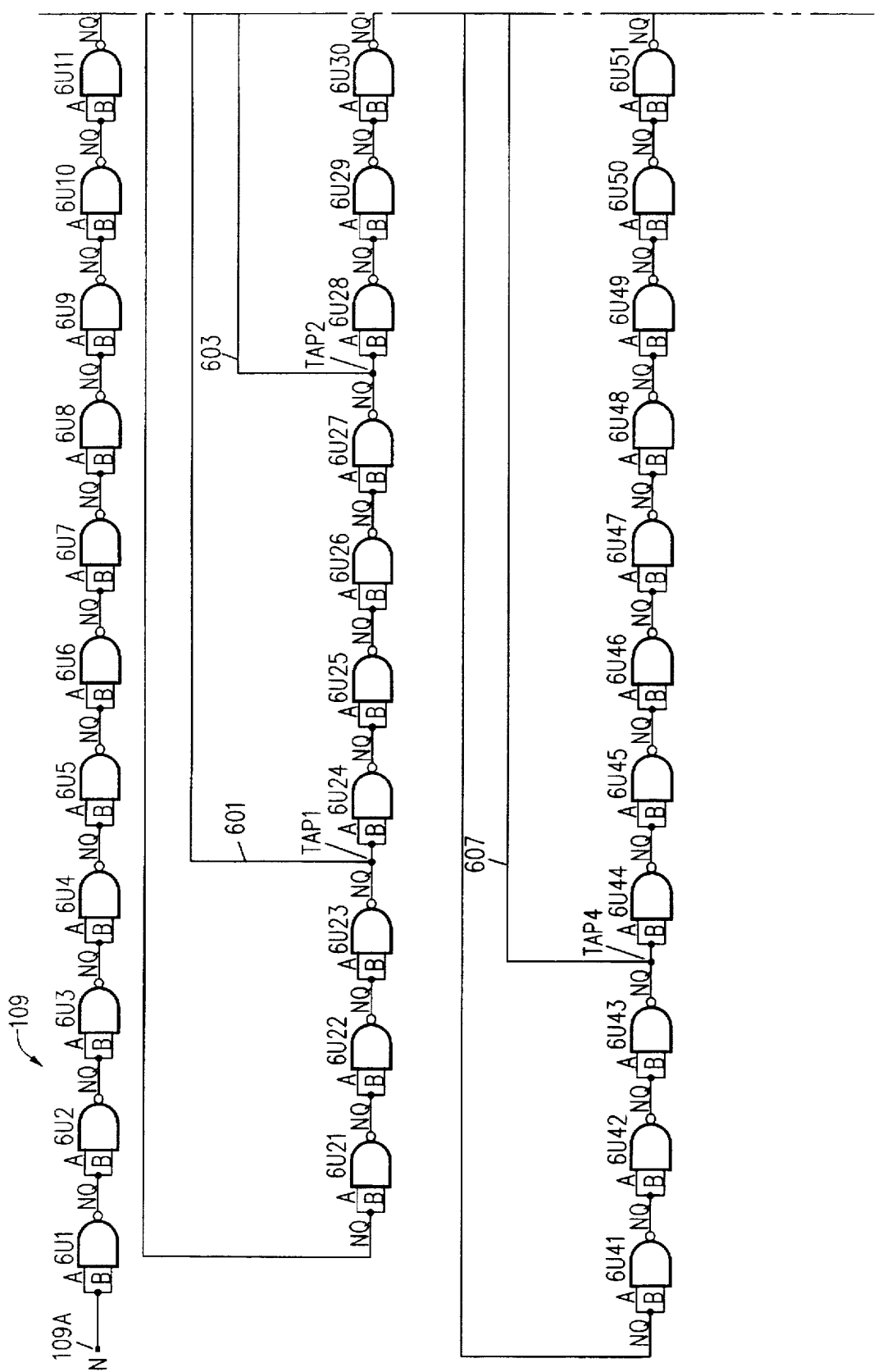
FIGS. 6A and 6B show one embodiment of a delay chain circuit in accordance with the invention.
Figure 6B:
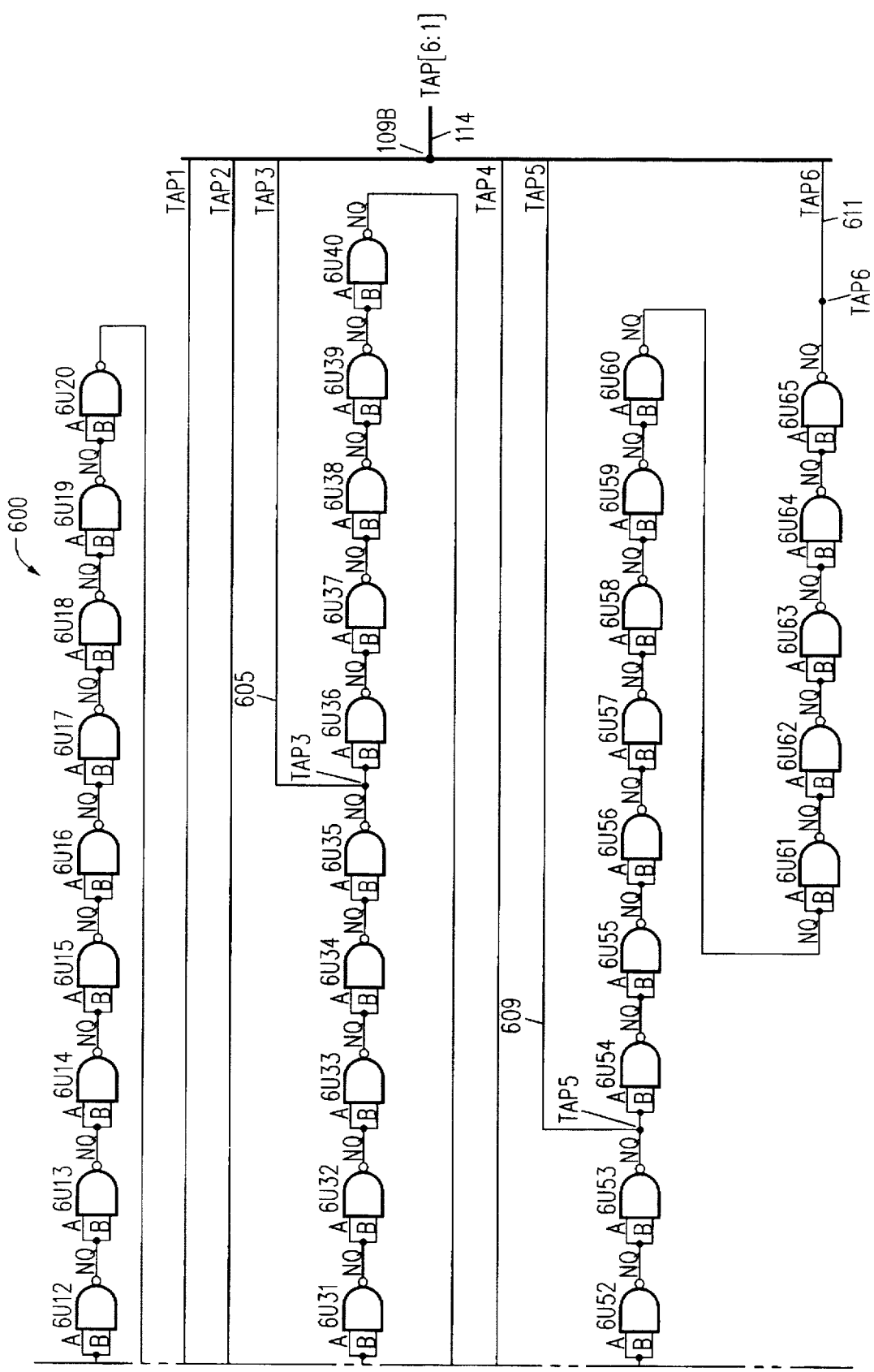

FIGS. 6A and 6B represent one embodiment of a delay chain circuit 109 in accordance with the invention. Delay chain circuit 109 includes a series of NAND gates 6U1 to 6U65 inclusive, which are connected in series with the output terminal of one NAND gate connected to both the A and B input terminals of the following NAND gate. A series of taps, TAP 1, TAP 2, TAP 3, TAP 4, TAP 5, and TAP 6, are located on NAND gate inverter chain 600. TAP 1 is connected to line 601 which carries a signal having a first signal delay time. TAP 2 is connected to line 603 which carries a signal having a second signal delay time. TAP 3 is connected to line 605 which carries a signal having a third signal delay time. TAP 4 is connected to line 607 which carries a signal having a fourth signal delay time. TAP 5 is connected to line 609 which carries a signal having a fifth signal delay time and TAP 6 is connected to line 611 which carries a signal having a sixth signal delay time.

The values of the various signal time delays provided at each of TAP 1 to TAP 6 is variable and can be selected by the manufacturer to meet the needs of the end user. The amount of time delay depends on the number of NAND gate inverters between input terminal 109A and a given tap. The number of gates, number of taps and their locations can also be varied to provide the desired delay and delay accuracy. As a result of the structure shown in FIG. 6A, delay times are provided that meet the designers delay needs to within an error margin of two inverter delays.

Lines 601 to 611 form delay taps bus 114 from delay chain circuit 109 (see FIG. 1A). Delay taps bus 114 connects the signals on TAP 1 to TAP 6 to drive input terminals 111D of output signal select circuit 111.

Figure 7:
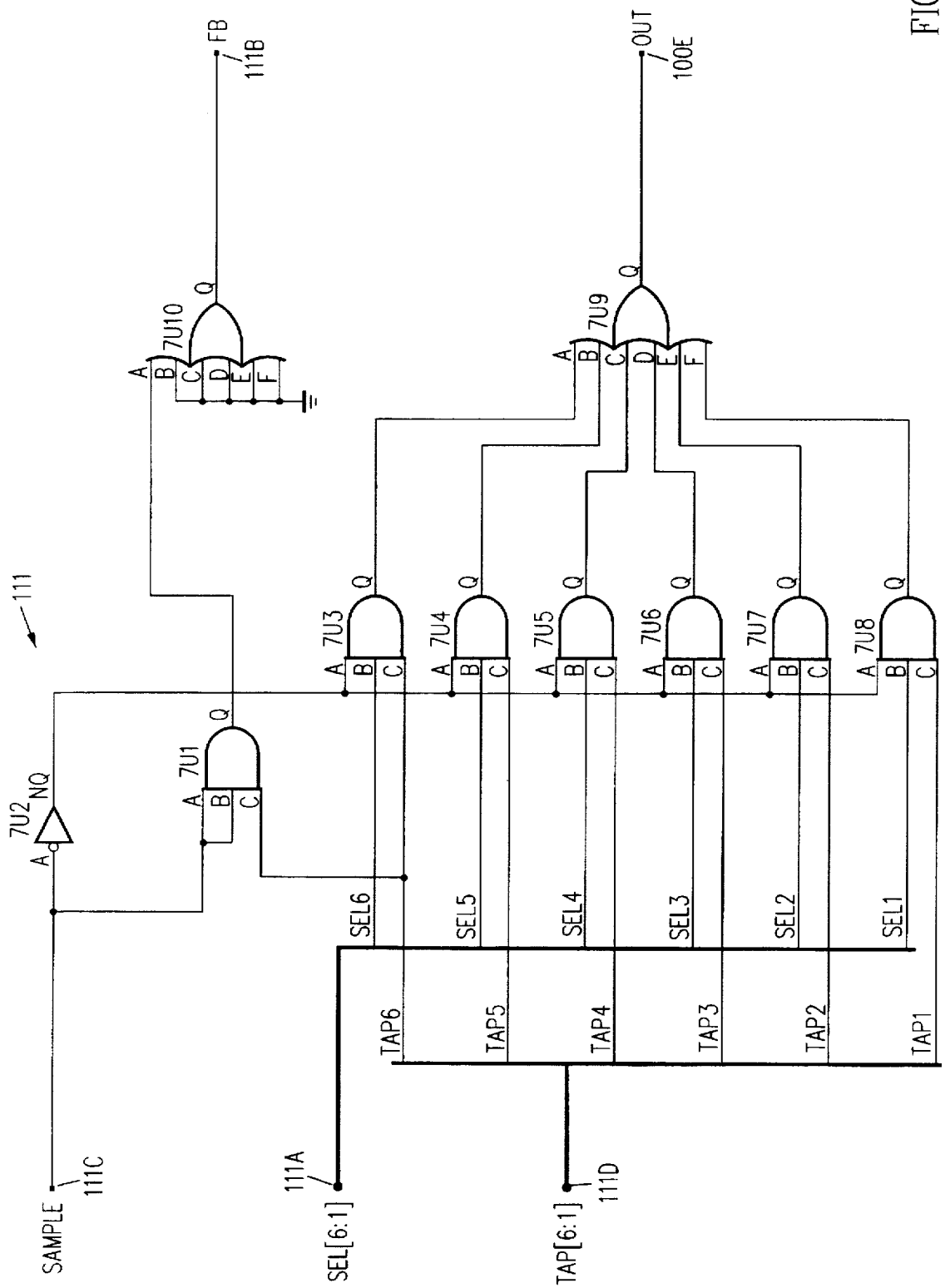
FIG. 7 is a gate level schematic of one embodiment of a output signal select circuit according to the invention.

One embodiment of output signal select circuit 111 is shown in FIG. 7. Output signal select circuit 111 receives input signals from (i) select input bus 106 at input terminals 111A; (ii) tap delay bus [6:1] from delay chain circuit 109 on input terminals 111D; and (iii) from sample gate signal line 120 on input terminal 111C. Output signal select circuit 111 also includes two output terminals, output terminal 111B, which is the feedback output terminal and is connected to input terminal 107C of delay input multiplexer 107, and output terminal 111E which provides the delayed output signal SIGOUT for digital delay circuit 100.

In the embodiment of output signal select circuit 111 shown in FIG. 7, AND gate 7U1, inverter 7U2, and OR gate 7U10 are optional. When implemented, AND gate 7U1, inverter 7U2, and OR gate 7U10 provide approximately the same delay for both the feedback signal and the input signal path. If this level of precision is not desired, these gates can be omitted thereby saving silicon space and production costs. If these gates are not included, input terminal 111C is connected to inverter 7U2 and feedback output terminal 111B.

Output signal select circuit 111 is typical of delay select multiplexers known in the art and therefore a detailed description of output signal select circuit 111 is omitted here to prevent detracting from the invention. It is worth noting however, that the input lines to output signal select circuit 111 are the six TAP lines, 601 to 611 (see FIGS. 6A and 6B), described above with respect to the delay chain circuit 109. One signal of the input signals on TAPs 1 to 6 is passed through output signal select circuit 111 based on the signals on bus 106 from count decoder circuit 105. In this way, output signal select circuit 111 chooses the signal which corresponds to the delay selected in count decoder circuit 105.

As a result of the logic operations performed in count decoder circuit 105, and the switching performed by output signal select circuit 111, a delayed signal SIGOUT is connected to output terminal 100E of digital delay circuit 100. This digitally delayed signal can be used as an input signal for various other systems as desired.

FIGS. 8A and 8B show a second embodiment of a digital delay circuit according to this invention. In this embodiment of the invention, the delay circuitry is connected to a filter circuit 809. The embodiment shown in FIGS. 8A and 8B includes: a calibrate control logic circuit 801; a calibration counter circuit 803; a count decoder and multiplexer circuit 805; a ring oscillator 807; and filter circuit 809.

In one embodiment of the circuit shown in FIGS. 8A and 8B, filter circuit 809 is a time domain signal filter. A time domain signal filter is used to eliminate spurious events which can occur in input signals used on a Small Computer System Interface (SCSI) bus. With a SCSI bus, a target device such as, a disk drive, a CD-ROM drive, a printer or a processor, is connected by the SCSI bus to a host computer that includes a host adapter circuit which implements the SCSI protocol. The SCSI protocol is an industry standard interface specification.

A detailed description of a time domain signal filter is set forth in the commonly assigned and co-pending application entitled "Time Domain Signal Filter" Ser. No. 08/300,284, filed Sep. 2, 1994, which is incorporated herein by reference in its entirety. In the discussion below, a description is set forth of digital delay circuit 800 while a detailed description of filter circuit 809 is omitted since filter circuit 809 is only an example of one use of the present invention.

Digital delay circuit 800 includes an initiator input terminal 800A and a target input terminal 800B. As discussed in more detail below, a signal on either initiator input terminal 800A or target input terminal 800B performs the same function as the calibrate signal CALSIG discussed above for digital delay circuit 100 (see FIGS. 1A and 1C). One of the signals on initiator input terminal 800A or target input terminal 800B shifts to an active state when other circuitry on the chip establishes a logical connection to another SCSI device. The separate input terminals 800A and 800B of digital delay circuit 800 (see FIGS. 8A and 8B) are necessitated by the fact that this embodiment of the invention is used with filter circuit 809 to supply filtered signals for a SCSI bus system. Accordingly, when either an initiator signal or a target signal is generated, an active signal is connected to input terminal 800A or 800B, respectively. As discussed in more detail below, the initiator or target signals are logically ORed within calibrate control logic circuit 801 to generate a single active signal.

Like digital delay circuit 100 discussed above, digital delay circuit 800 includes a reference clock signal input terminal 800C (see FIG. 8A), which corresponds to input terminal 100A of digital delay circuit 100 (see FIG. 1A), and a reset signal input terminal 800D (see FIG. 8A), which corresponds to input terminal 101F of digital delay circuit 100 (see FIG. 1A). In one embodiment of digital delay circuit 800, the frequency of reference clock signal REF-CLK is 20 MHz.

The unfiltered signal input terminal 800F (see FIG. 8A) couples an input signal to input terminal 809A of filter circuit 809. Input terminal 800F corresponds to input terminal 100C of digital delay circuit 100 (see FIG. 1A). Digital delay circuit 800 also includes a separate counter test input terminal 800R (see FIG. 8A).

As with digital delay circuit 100, an active reset signal RESET causes logic elements in calibrate control logic circuit 801 to shift to the reset state and causes calibrate control logic circuit 801 to generate an active clear signal CLEAR- at output terminal 801F which is connected to input terminal 803C of calibration counter circuit 803. Active clear signal CLEAR- zeroes registers contained in calibration counter circuit 803, i.e., resets the registers to a predetermined state.

Those of skill in the art will recognize that various other methods of putting the system into a known state prior to initiating the auto-calibration mode can be employed. The reset signal and clear signal system is described above for illustrative purposes only and is not meant to be limiting.

A reference clock signal REFCLK is connected to calibrate control logic circuit 801 through input terminal 801C. FIG. 1B shows a typical reference clock signal REFCLK including trigger edges 113 and 115. In this embodiment of the invention, reference clock signal REFCLK is typically a 20 MHz signal generated by a local oscillator in another portion of the system. However, as with digital delay circuit 100, reference clock signal REFCLK can be any frequency desired and can be generated by any means which produces a stable output frequency.

Once digital delay circuit 800 is initialized as described above, digital delay circuit 800 is ready for operation when either an initiator signal on input terminal 800A, or a target signal on input terminal 800B, goes to the active state. A typical initiator signal or target signal is similar to calibrate signal CALSIG shown in FIG. 1C.

When either the initiator or target signal is active on either input terminal 801A or input terminal 801B, respectively, of calibrate control logic circuit 801 (see FIG. 8A), calibrate control logic circuit 801 uses reference clock signal REFCLK to generate a sample gate signal SAMGATE at output terminal 801E which is connected to input terminal B of OR gate 802. A typical sample gate signal SAMGATE is shown in FIG. 1D and includes transitional edges 121 and 123. The presence of a high signal at input terminal B of OR gate 802 results in a high signal at output terminal Q of OR gate 802, regardless of the state of the signal at input terminal A. Output terminal Q of OR gate 802 drives input terminal 803A of calibration counter circuit 803 and input terminal 807A of ring oscillator 807.

Figure 9A:
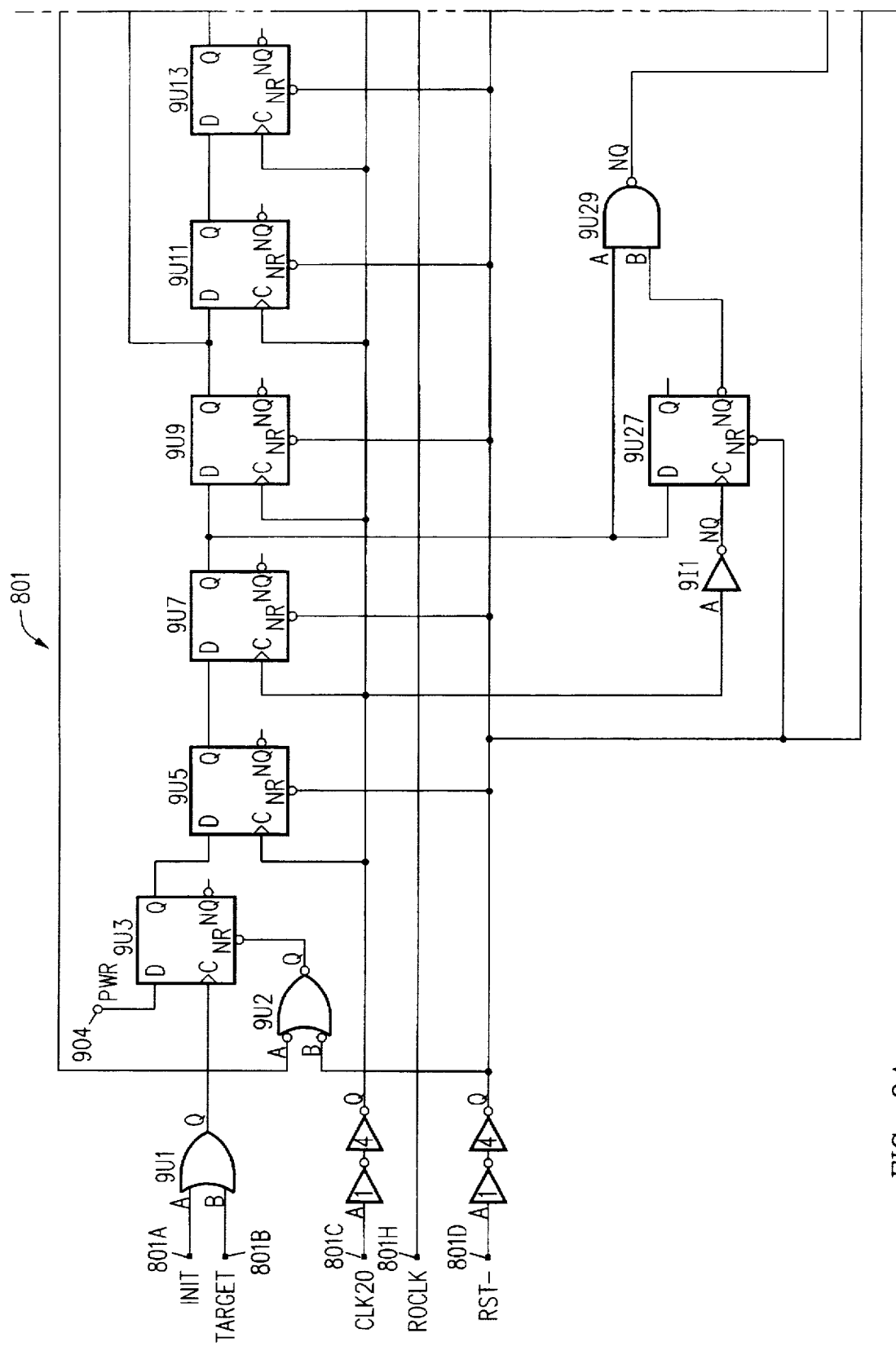
FIGS. 9A and 9B show a gate level schematic of the calibrate control logic circuit according to the second embodiment of the invention shown in FIGS. 8A and 8B.
Figure 9B:
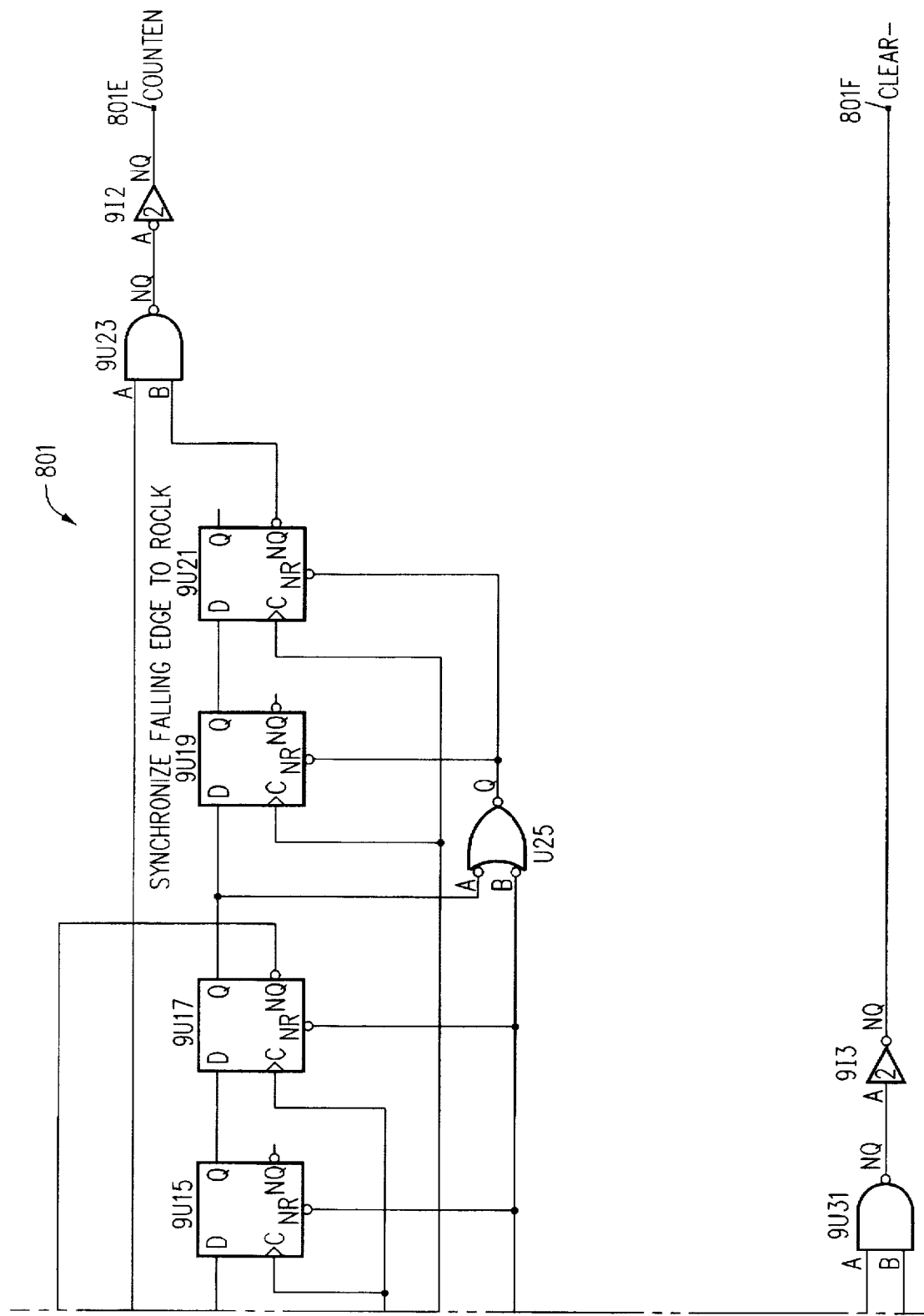

FIGS. 9A and 9B show a gate level schematic of calibrate control logic circuit 801. As discussed above, the initiate input terminal 801A and the target input terminal 801B are connected to input terminals A and B, respectively, of OR gate 9U1 so that a high signal on either input terminal 801A or 801B results in a high signal at input terminal C of D-type flip-flop 9U3, hereafter flip-flop 9U3.

Calibrate control logic circuit 801 uses a series of ten D-type flip-flops, 9U3, 9U5, 9U7, 9U9, 9U11, 9U13, 9U15, 9U17, 9U19, and 9U21 combined with various logic gates, 9U1, 9U2, 9U23, 9U25, 9U29, and 9U31, and inverters, 911, 912, and 913, to produce a sample gate signal SAMGATE similar to the sample gate signal SAMGATE produced by calibrate control logic circuit 101 in digital delay circuit 100 discussed above (see FIG. 1D). Those of skill in the art will recognize that the operation of calibrate control logic circuit 801 uses a shift register in place of a counter but is substantially the same function as the operation of calibrate control logic circuit 101. Since a detailed discussion of calibrate control logic circuit 101 is provided above, the reader is referred to that discussion.

Sample gate signal SAMGATE is connected to output terminal 801E of calibrate control logic circuit 801. Calibrate control logic circuit 801 includes a ring oscillator clock input terminal 801H. A ring oscillator clock input signal on terminal 801H is connected to a clock input terminal C of D-type flip-flops 9U19 and 9U21 which are used to synchronize falling edge 123 (see FIG. 1D) of sample gate signal SAMGATE to the ring oscillator clock signal. This prevents calibration control logic circuit from going into a meta-stable state when sample gate signal SAMGATE goes inactive because, in this embodiment of the invention, when sample gate signal SAMGATE goes inactive, calibration control logic circuit 801 is being clocked by the ring oscillator clock signal.

Calibrate control logic circuit 801 also includes: inverter 9I1; D-type flip-flop 9U27; NAND gates 9U29 and 9U31; and inverter 913 to generate clear signal CLEAR- when either the initiate signal at terminal 801A, the target signal at terminal 801B, or the reset signal at input terminal 801D goes active. Clear signal CLEAR- is connected to calibration counter circuit 803 at input terminal 803C (see FIG. 8B). As discussed above, clear signal CLEAR- is provided to insure that prior to beginning the auto-calibration mode of operation, registers in calibration counter circuit 803 are in a known state, i.e., are zeroed or reset.

Sample gate signal SAMGATE is connected to input terminal 807A of ring oscillator 807. As with delay chain circuit 109 of digital delay circuit 100 (see FIG. 1A), the output signal of ring oscillator 807 oscillates during the auto-calibration mode of operation, i.e., the time interval when sample gate signal SAMGATE is active. As is also true of digital delay circuit 100, the oscillations of the output signal of ring oscillator 807 are counted by calibration counter circuit 803 during the time interval when sample gate signal SAMGATE is active.

As with delay chain circuit 109 (see FIGS. 1A, 4A, and 4B), ring oscillator 807 also includes a plurality of delay taps to provide a plurality of delayed signals during the normal delay mode operation of digital delay circuit 800, i.e., when sample gate signal SAMGATE is in the inactive state. In addition, since, in this embodiment of the invention, digital delay circuit 800 is used with filter circuit 809, ring oscillator 807 includes a trigger negative input terminal 807B which is connected to a trigger negative output terminal 809J of filter circuit 809. The signal at trigger negative output terminal 809J triggers ring oscillator 807 when the leading edge of a signal on input terminal 800F is detected.

Figure 10A:
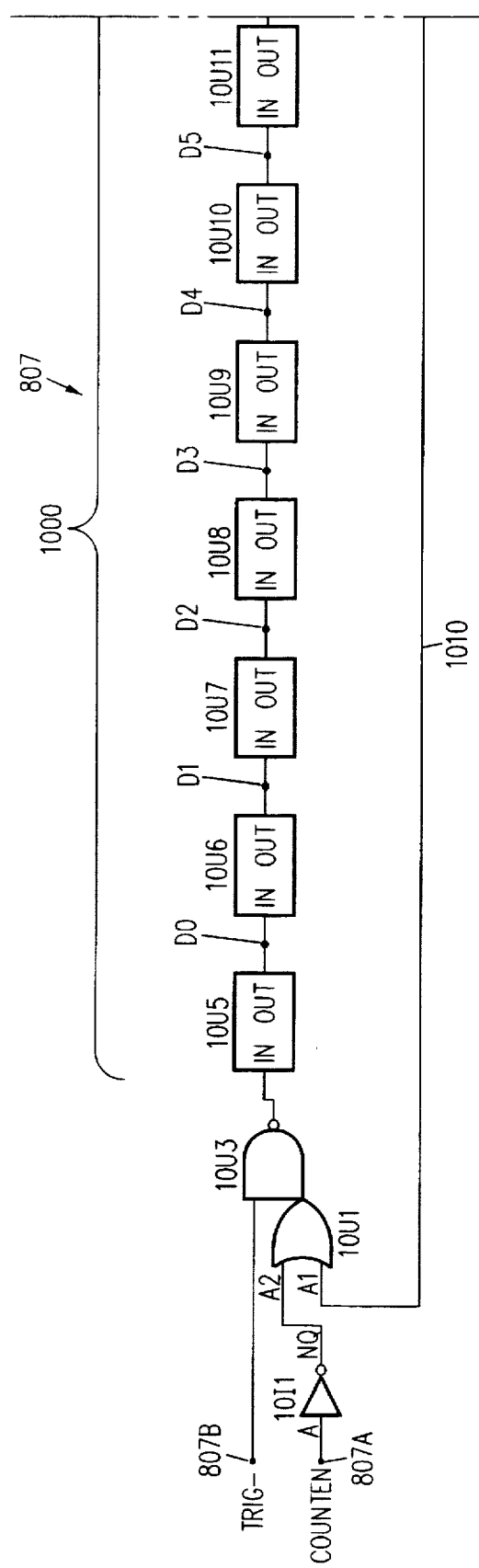
FIGS. 10A to 10D show a gate level schematic of a ring oscillator circuit according to the second embodiment of the invention shown in FIGS. 8A and 8B.
Figure 10B:
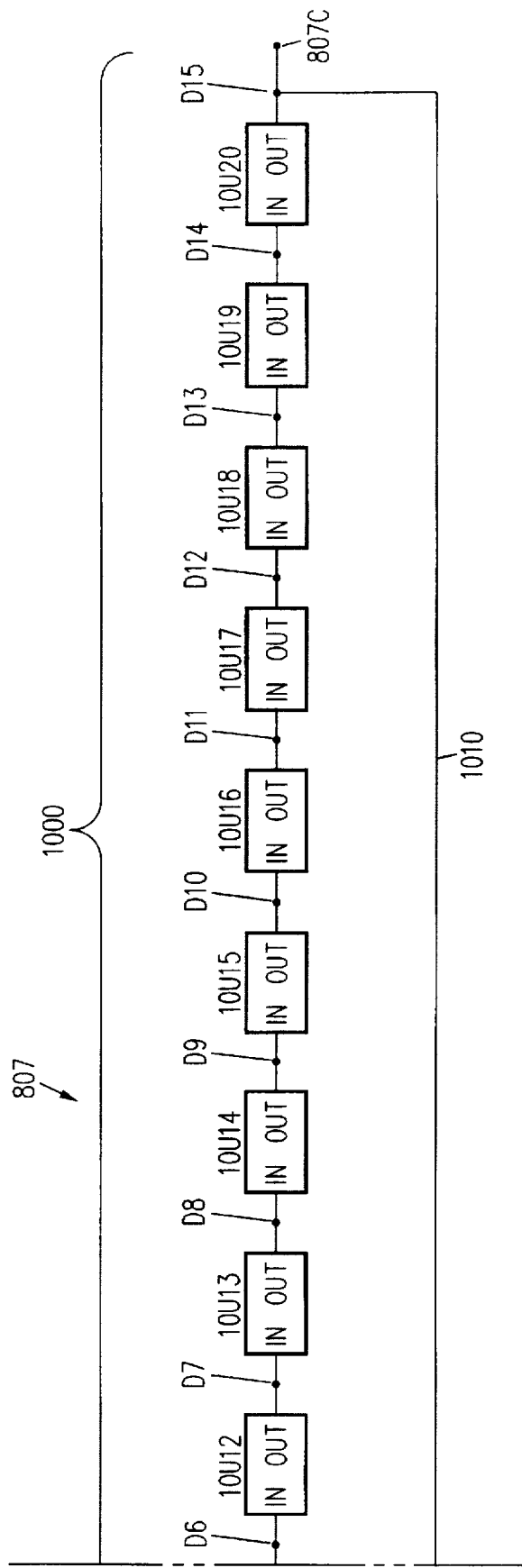
Figure 10C:
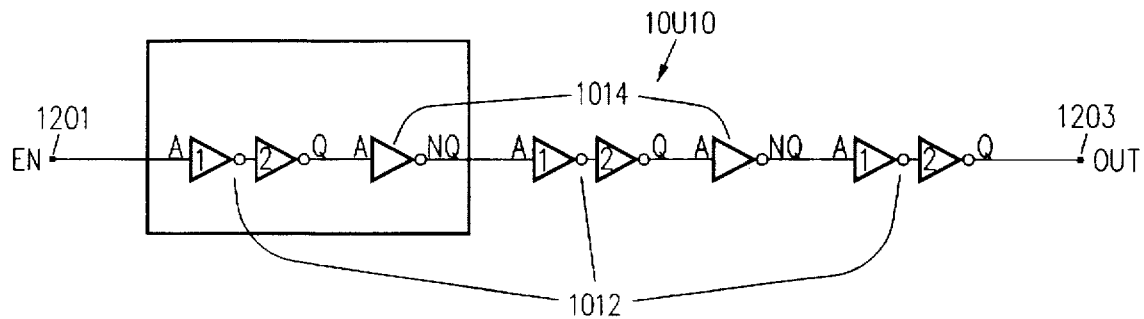

FIGS. 10A and 10B show a gate level schematic diagram of ring oscillator 807. Ring oscillator 807 includes delay chain circuit 1000 composed of delay elements 10U5 to 10U20. A typical delay element 10U10 is shown in FIG. 10C. As can be seen in FIG. 10C, in one embodiment of the invention, each delay element consists of three buffers 1012 and two inverters 1014.

Figure 10D:
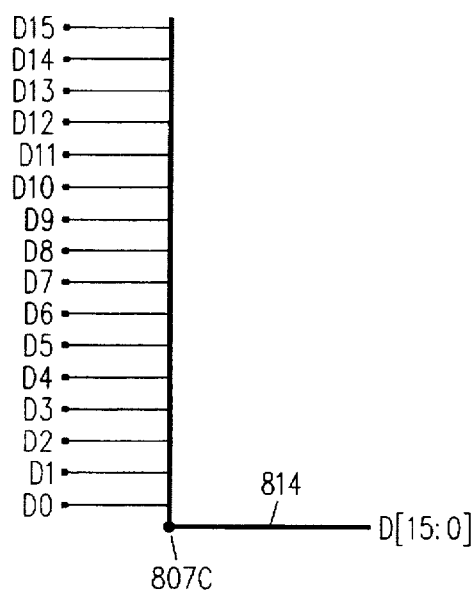

A series of delay taps D0 to D15 are connected between each of the delay elements 10U5 to 10U20. When a signal is present on delay chain circuit 1000, a time delayed signal is generated at each of the delay taps D0 to D15. Delay taps D0 to D15 each drive a line in delay taps bus 814 (see FIG. 10D). Delay taps bus 814 is connected from output terminals 807C to input terminals 805C of count decoder and multiplexer circuit 805 (see FIG. 8A).

In one embodiment of the invention, during the normal delay mode of operation, i.e., when sample gate signal SAMGATE is inactive, input terminal 807A of ring oscillator 807 is driven low, as is input terminal A of inverter 1011 (see FIG. 10A). Consequently, input terminal A2 of OR gate 10U1 is driven high as is input terminal A of NAND gate 10U3. When an unfiltered signal is connected to input terminal 800F of digital delay circuit 800 and to input terminal 809A of filter circuit 809 (see FIG. 8A), a trigger negative signal is connected from output terminal 809J of filter circuit 809 and to input terminal 807B of ring oscillator 807. Therefore, input terminal B of NAND gate 10U3 is driven low and output terminal NQ of NAND gate 10U3 is driven high.

Output terminal NQ of NAND gate 10U3 remains high as long as the signal at input terminal 807B remains low. Therefore, the signal at output terminal NQ of NAND gate 10U3 tracks the signal at input terminal 809A of filter circuit 809. The high signal at output terminal NQ of NAND gate 10U3 is connected to delay chain circuit 1000 composed of delay elements 10U5 to 10U20. Signals of various predetermined propagation delay times are therefore present at each of delay taps D0 to D13 of ring oscillator 807. As with digital delay circuit 100, the actual signal chosen is determined by the count of calibration counter circuit 803 during the time interval when sample gate signal SAMGATE is active.

Ring oscillator 807 includes a feedback line 1010 which is similar to feedback line 110 of digital delay circuit 100 (see FIG. 1A). In one embodiment of the invention, when digital delay circuit 800 is in auto-calibration mode, i.e., when sample gate signal SAMGATE is active, input terminal 807A is driven high. The high signal is inverted to a low signal at output terminal NQ of inverter 1011, and provided to input terminal A1 of OR gate 10U1 (see FIG. 10A). During auto-calibration mode no input signal is connected to input terminal 809A of filter circuit 809, therefore, the signal at input terminal 807B is high. The signal at input terminal A1 of OR gate 10U1, which is connected to feedback line 1010, therefore determines the signal at output terminal NQ of NAND gate 10U3. That is, when the signal at input terminal A1 is low, the signal at output terminal NQ is high and vice-versa. Consequently, in auto-calibration mode, OR gate 10U1 and NAND gate 10U3 function as an inverter for the input signal to ring oscillator 809 and this causes the output signal of ring oscillator 809 to oscillate.

In auto-calibration mode, while the output signal of ring oscillator 807 is oscillating as discussed above, a ring oscillator clock signal ROCLK is connected from line D15 of delay taps bus 814 to ring oscillator clock line 810 (see FIGS. 8A and 8B). Ring oscillator clock line 810 is connected to input terminal 801H of calibrate control logic circuit 801 and to input terminal 803B of calibration counter circuit 803. As discussed above, the signal at input terminal 801H of calibrate control logic circuit 801 provides synchronization between the trailing edge of sample gate signal SAMGATE and the ring oscillator clock.

As with calibration counter circuit 103 of digital delay circuit 100, calibration counter circuit 803 counts the oscillations of the output signal of ring oscillator 807 on line 810 during the period when sample gate signal SAMGATE is active.

Input terminal 803A of calibration counter circuit 803 is connected to output terminal Q of OR gate 802 (see FIG. 8A). Input terminal A of OR gate 802 is connected to counter test line 821 and input terminal 800R of digital delay circuit 800. Input terminal B of OR gate 802 is connected to output terminal 801E of calibrate control logic circuit 801 by sample gate line 820. Therefore, whenever sample gate signal SAMGATE, or counter test signal CNTRTEST, is active, output terminal Q of OR gate 802, which in turn drives input terminal 803A of calibration counter circuit 803, is high. As discussed above, calibration counter circuit 803 also includes input terminal 803C for receiving clear signal CLEAR- when sample gate signal SAMGATE first goes active.

Figure 11:
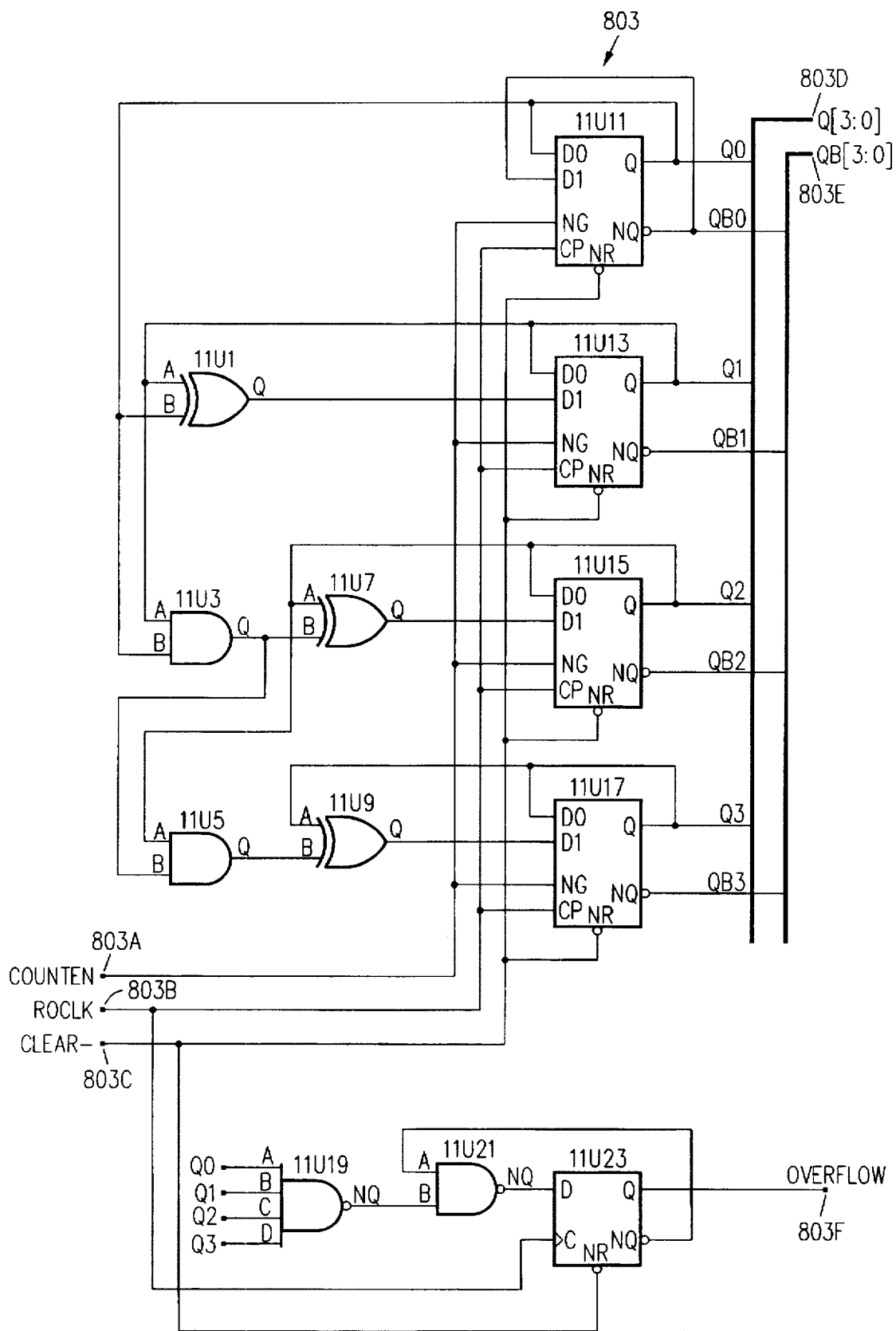
FIG. 11 shows a gate level schematic of a calibration counter circuit according to the second embodiment of the invention shown in FIGS. 8A and 8B.

FIG. 11 shows a gate level schematic diagram of calibration counter circuit 803. As with calibration counter circuit 103 of digital delay circuit 100 (see FIGS. 1A, 5A and 5B), calibration counter circuit 803 is a binary counter such as is well known to those of skill in the art (see FIG. 11). Calibration counter circuit 803 includes flip-flops 11U11, 11U13, 11U15, and 11U17 which, in one embodiment of calibration counter circuit 803, are dual input multiplexer D-type flip-flops. Dual input multiplexer D-type flip-flops are well known to those of skill in the art.

Flip-flops 11U11, 11U13, 11U15, and 11U17 have two modes of operation. When sample gate signal SAMGATE is inactive, i.e., during normal delay mode, flip-flops 11U11, 11U13, 11U15, and 11U17 select the signal D0. Since input terminal D0 of each flip-flop 11U11, 11U13, 11U15, and 11U17 is connected to its output terminal Q, this mode of operation is a feedback or hold mode. When sample gate signal SAMGATE is active, i.e., in auto-calibration mode, flip-flops 11U11, 11U13, 11U15, and 11U17 select the signal on input terminal D1 and act as standard D-type counters. Consequently, in auto-calibration mode, calibration counter circuit 803 counts the oscillations of the output signal of ring oscillator 809 on line 810.

Signals corresponding to the number of oscillations counted by calibration counter circuit 803 during the period when sample gate signal SAMGATE is active are driven on: lines Q0, Q1, Q2, and Q3 which form output bus Q[3:0]; lines QB0, QB1, QB2, and QB3 which form output bus QB[3:0], and line 803F which is the overflow line (see FIG. 8B).

An active signal on line Q0 corresponds to a count of one oscillation of the output signal of ring oscillator 807; an active signal on line Q1, a count of two; an active signal on line Q2, a count of four; and an active signal on line Q3, a count of eight.

The signals on lines QB0, QB1, QB2, and QB3 are in the state opposite to the state of the signals on lines Q0, Q1, Q2, and Q3, respectively, at any given time.

In addition, calibration counter circuit 803 includes overflow output line 803F and overflow circuitry including NAND gate 11U19, NAND gate 11U21, and D-type flip-flop 11U23. The purpose of the overflow circuitry and the overflow signal at output terminal 803F is to provide a mechanism to indicate that the oscillations of the output signal of ring oscillator 807 are greater than the maximum count capability of calibration counter circuit 803 during the period when sample gate signal SAMGATE is active.

When the count capability is exceeded, the signal on overflow output line 803F goes active to indicate the overflow condition. The active overflow signal on overflow output line 803F is processed separately by count decoder and multiplexer circuit 805. If the number of oscillations of the output signal of ring oscillator 807 exceeds the capacity of calibration counter circuit 803, an automatic and predetermined default signal delay time is still provided for the output signal at output terminal 800G of digital delay circuit 800.

The signals on output bus Q[3:0] are connected to input terminal 805A of count decoder and multiplexer circuit 805 (see FIGS. 8A and 8B). Similarly, the complementary signals on output bus QB[3:0] are connected to input terminals 805B of count decoder and multiplexer circuit 805. Overflow output line 803F is connected to input terminal 805D of count decoder and multiplexer circuit 805.

Count decoder and multiplexer circuit 805 performs the same functions as count decoder circuit 105 and output signal select circuit 111 of digital delay circuit 100 (see FIG. 1A and the discussion above). FIGS. 12A and 12B show a gate level schematic of count decoder and multiplexer circuit 805. At the end of the auto-calibration mode of operation, i.e., when sample gate signal SAMGATE goes back to the inactive state, the signals on output bus Q[3:0] and output bus QB[3:0] are connected to AND gates 12U1 to 12U13 of count decoder and multiplexer circuit 805 in the order shown in FIGS. 12A and 12B. AND gates 12U1-12U13 are configured such that only one of the AND gates 12U1 to 12U13 has a high signal present at its output terminal Q for a given count from calibration counter circuit 103.

Each output terminal Q of an AND gate in the plurality of AND gates 12U1 to 12U12 is connected to a corresponding input terminal A of a NAND gate in the plurality of NAND gates 12U21 to 12U32 respectively. In addition, output terminal Q of AND gate 12U13 is connected to input terminal A of OR gate 12U40. Consequently, at the end of the time interval when sample gate signal SAMGATE is active, only one of the NAND gates in the plurality of NAND gates 12U21 to 12U33 has a high signal present at its input terminal A and the one NAND gate in the plurality of NAND gates 12U21 to 12U33 with the high signal at its input terminal A is the NAND gate which corresponds to the particular count from calibration counter circuit 103. The signals at input terminals A of NAND gates 12U21 to 12U33 remain static during the time interval when sample gate signal SAMGATE is inactive, i.e., during the period when digital delay circuit 800 is in the normal delay mode of operation.

Input terminals B of NAND gates 12U21 to 12U33 are connected to delay taps D0 to D13 through the individual lines in delay taps bus 814 (see FIG. 8A). FIG. 12C shows the relationship between delay taps bus 814 and the lines from delay taps D0 to D15.

As discussed above, during the normal delay mode of operation, output terminal NQ of AND gate 10U3 in ring oscillator 807 is driven high and is connected to delay chain circuit 1000 composed of delay elements 10U5 to 10U20 (see FIGS. 10A and 10B). When the high signal reaches the one delay tap of delay taps D0 to D15 connected to the B input terminal of the one NAND gate which also has a high signal on its A input terminal, the output terminal NQ of that NAND gate is driven low. All other NAND gates, i.e., those which have a low signal on their input terminals A, continue to have a high signal at their output terminals NQ.

Output terminals NQ of NAND gates 12U21 to 12U25 are connected to input terminals A to E of AND gate 12U51, respectively (see FIG. 12A). Output terminals NQ of NAND gates 12U26 to 12U33 are connected to input terminals A to H of AND gate 12U52, respectively (see FIG. 12B). Therefore, if a low signal is present at an output terminal NQ of one of the NAND gates of the plurality of NAND gates 12U21 to 12U25, output terminal Q of AND gate 12U51 is driven low. However, if none of NAND gates 12U21 to 12U25 have a low signal at output terminal NQ, then output terminal Q of AND gate 12U51 is also driven high.

Similarly, if an output terminal NQ of one NAND gate in the plurality of NAND gates 12U26 to 12U33 is driven low, the output signal of AND gate 12U52 will also be low. However, if none of output terminals NQ of NAND gates 12U26 to 12U33 are driven low, the output signal of AND gate 12U52 will be high.

Output terminal Q of AND gate 12U51 is connected to output terminal 805E of count decoder and multiplexer circuit 805. The output terminal Q of AND gate 12U52 is connected to output terminal 805F of count decoder and multiplexer circuit 805.

The signal at output terminal 805E is designated delay signal DELAY7NSA-. The signal at output terminal 805F is designated delay signal DELAY7NSB-. Delay signal DELAY7NSA- and delay signal DELAY7NSB- are connected to input terminals 809D and 809E, respectively, of filter circuit 809 (see FIG. 8A).

An example of the operation of count decoder and multiplexer circuit 805 during the auto-calibration mode of operation is discussed below. For this example, it is assumed a count of eight is recorded by calibration counter circuit 803 during the time interval when sample gate signal SAMGATE is active.

FIG. 12D shows the state of the signals on lines Q0 to Q3 and lines QB0 to QB3 for a count of eight from calibration counter circuit 803. In FIG. 12D, a "1" corresponds to a logic one, i.e., a high signal and a "0" corresponds to a logic zero, i.e., a low signal. A low signal, i.e., a "0" at any of the input terminals of any one of AND gates 12U1 to 12U13 will result in a low signal at output terminal Q of that AND gate.

The signals shown in FIG. 12D are processed by count decoder and multiplexer circuit 805 as follows (see FIGS. 12A and 12B): input terminals A of AND gates 12U1, 12U2, 12U3, 12U4, and 12U5 are all driven low, and so the output signals from these AND gates are all low.

Since none of output terminals Q of AND gates 12U1 to 12U5 is driven high, none of output terminals NQ of NAND gates 12U21 to 12U25 is driven low. Therefore, output terminal Q of AND gate 12U51 is driven high and the signal on output terminal 805E of count decoder and multiplexer circuit 805 is high.

Input terminals A of AND gates 12U7, 12U8, 12U9, 12U10, 12U11, 12U12, and 12U13 are all driven low, and so the output signals from these AND gates are all low.

Since none of output terminals Q of AND gates 12U7 to 12U13 is driven high, none of output terminals NQ of NAND gates 12U27 to 12U33 is driven low.

However, input terminals A, B, C, D and E of AND gate 12U6 are all driven high. Therefore, output terminal Q of AND gate 12U6 is also driven high. It follows that AND gate 12U6 is the AND gate which corresponds to a count of eight from calibration counter circuit 803. Since output terminal Q of AND gate 12U6 is driven high, input terminal A of NAND gate 12U26 is also driven high and output terminal NQ of NAND gate 12U26 is driven low. Therefore, output terminal Q of AND gate 12U52 is driven low and the signal on output terminal 805F of count decoder and multiplexer circuit 805 is low. The low signal at output terminal 805F of count decoder and multiplexer circuit 805 is connected to input terminal 809E of filter circuit 809 (see FIG. 8A).

Those of skill in the art will appreciate that other configurations for a count decoder and multiplexer circuit 805 are possible. Therefore, the one embodiment of count decoder and multiplexer circuit 805 discussed above is merely illustrative and not limiting.

FIG. 13 shows a gate level schematic of one embodiment of filter circuit 809. FIG. 14 is a signal diagram for filter circuit 809. As discussed above, a detailed description of filter circuit 809 is omitted here to avoid detracting from the present invention. For a detailed description of one embodiment of a filter see the commonly assigned application discussed above.

As seen in FIG. 13, delay signal DELAY7NSA- and delay signal DELAY7NSB- are connected from output terminals 805E and 805F, respectively, of count decoder and multiplexer circuit 805 to input terminals 809D and 809E, respectively, of filter circuit 809. In addition to input terminal 809D and input terminal 809E, the embodiment of filter circuit 809 shown in FIG. 13 includes: reference clock signal input terminal 809B; unfiltered signal input terminal 809A; counter reset input terminal 809C; clear signal input terminal 809H; ULTRADPHASE input terminal 809G; and DFON input terminal 809F.

The embodiment of filter circuit 809 shown in FIG. 13 also includes: NAND gate 13U1; AND gate 13U2; AND gate 13U3; OR gate 13U4; AND gate 13U5; D-type flip-flop 13U6; OR gate 13U7; and delay elements 13UD1 and 13UD2. Filter circuit 809 has two output terminals, the filtered signal negative output terminal 809I and the trigger negative output terminal 809J.

During normal operation of filter circuit 809 with SCSI bus system, input terminals 809F, 809G and 809H are all driven high and input terminal 809C is driven low. Therefore, input terminal C of AND gate 13U3 is driven high (see FIG. 13). Consequently, when delay signal DELAY7NSA- and delay signal DELAY7NSB- are inactive, the signal at output terminal Q of AND gate 13U3 is high (see FIG. 14).

When the signal at output terminal Q of AND gate 13U3 is high and flip-flop 13U6 has detected a rising edge on signal UFLTRSIG at terminal 809A, the signal at output terminal Q of flip-flop 13U6 is high and the output of OR gate 13U7 is high, regardless of the signal at input terminal A of OR gate 13U7. Therefore, the signal at output terminal 809I is high as long as the output of AND gate 13U3 is high and flip-flop 13U6 has detected a rising edge on signal UFLTRSIG at terminal 809A (see FIG. 14).

However, when either delay signal DELAY7NSA- or delay signal DELAY7NSB- goes active, i.e., low, (see FIG. 14 at 1401) the signal at output terminal Q of OR gate 13U3 is low (see FIG. 14 at 1403) and this low signal holds flip-flop 13U6 in reset. Therefore, the signal at output terminal Q of flip-flop 13U6 is low (see FIG. 14 at 1405), which in turn drives input terminal B of OR gate 13U7 low (see FIG. 13). As a result, the signal at output terminal Q of OR gate 13U7 alternates between high and low, tracking the falling edge of unfiltered signal UFLTRSIG- (see FIG. 14) and rising edge of the signal at output terminal Q of OR gate 13U7 is controlled by the trigger (TRIG) output of flip-flop 13U6.

Delay signal DELAY7NSA- and delay signal DELAY7NSB- are signal time delayed by ring oscillator 807 and count decoder and multiplexer circuit 805 as discussed above. Therefore, flip-flop 13U6 is held in reset by the time delay determined in the auto-calibration mode of operation of digital delay circuit 800.

Thus, the combination of digital delay circuit 800 and filter circuit 809 provides a filtered output signal at terminal 809I (see FIG. 13) which includes a signal time delay 1407 (see FIG. 14) which is calibrated with each initiator or target signal generated. One application of digital delay circuit 800 and filter circuit 809 is to prevent spurious signals, such as reflected signals, from triggering a circuit response by delaying the output signal by a specified time.

In both digital delay circuits 100 and 800, the output signal of the delay chain circuit 109, or ring oscillator 807, oscillates during the auto-calibration mode of operation and the oscillations are counted to determine the actual signal delay time for the current conditions. In both digital delay circuits 100 and 800, the same delay chain circuit 109, or ring oscillator 807, is also used to provide the desired delay time.

Since the same component, i.e., delay chain circuit 109, or ring oscillator 807, is used to determine the actual signal delay time, and a selected fraction of the delay chain or ring oscillator is used to provide the desired delay time, any speeding up or slowing down of the signal processing capability of digital delay circuits 100 or 800 is taken into account and effectively canceled out during the auto-calibration mode. Thus, if digital delay circuits 100 and 800 are placed in the auto-calibration mode at regular intervals, or prior to delaying any signal, any change in the processing speed of delay chain circuit 109, or ring oscillator 807, will also be present in delay chain circuit 109, or ring oscillator 807, when delay chain circuit 109, or ring oscillator 807, is used to provide the oscillation count to drive the auto-calibration process. Therefore, any change in the processing speed is automatically taken into account and canceled out.

Further, in both digital delay circuits 100 and 800, all circuit components are standard logic components and therefore can be formed on the same chip. Consequently, any change in the temperature, average voltage, or other physical parameters, of one portion of digital delay circuit 100 or 800 will be virtually identical to changes in the other portion.

Further, since digital delay circuits 100 and 800 use standard logic components, digital delay circuits 100 and 800 can be used with any standard semiconductor technology and no post fabrication processing, such as laser trimming, is required.

As discussed above, digital delay circuits 100 and 800 can produce relatively short signal delay times without requiring a special high frequency clock. Further, digital delay circuits 100 and 800 can generate delay times which have delay time accuracy within plus or minus two inverter delays. Consequently, digital delay circuits 100 and 800 are suitable for use in deglitching filters, data separators, or any other circuitry which requires a signal delay time more accurate than can be provided by a simple inverter chain.

In view of the disclosure, those skilled in the art will appreciate that the logic components discussed above can be rearranged or replaced with substantially similar components to create circuitry which may differ somewhat from that discussed above, but which performs substantially the same function and yields substantially the same result. Further, by rearranging the logic components discussed above, high signals can be substituted with low signals and vice versa.

Therefore, the embodiments of the invention discussed above are presented for illustrative purposes only and are not meant to be limiting. The various modifications and adaptations of the above-discussed embodiments are encompassed by this invention as set forth in the appending claims.

We claim:

1. A digital delay circuit comprising:
   a digital calibration circuit having a sample gate output line;
      wherein in an auto-calibration operation mode of said digital delay circuit, said digital calibration circuit generates a sample gate signal having a second state on said sample gate output line; and
   a digital delayed signal generator having:
      a signal input line;
      a delayed signal output line;
      a feedback input terminal;
      a feedback line connected to said digital calibration circuit and to said feedback input terminal of said digital delayed signal generator;
      a digital signal delay chain having an input terminal and a plurality of signal delay taps;
      an input signal select terminal connected to said sample gate output line
         wherein in response to said sample gate signal having a first state on said sample gate output line, said signal input line is connected to said input terminal of said digital signal delay chain for a normal mode of operation; and
         in response to said sample gate signal having said second state, said feedback input terminal is connected to said input terminal of said digital signal delay chain, and a delay tap in said plurality of signal delay taps having a specified time delay is connected to said feedback line so that said digital signal delay chain is used in both said auto-calibration mode of operation and in said normal mode of operation.

2. A digital delay circuit as in claim 1 wherein said digital calibration circuit further comprises a calibration control input line wherein said digital calibration circuit generates said sample gate signal having said second state in response to an active signal on said calibration control input line.

3. A digital delay circuit as in claim 2 wherein said a digital calibration circuit further comprises:
   a calibration control logic circuit connected to said calibration control input line and to said sample gate output line wherein said calibration control logic circuit generates said sample gate signal having said second state on said sample gate output line in response to said active signal on said calibration control input line.

4. A digital delay circuit as in claim 3 wherein said digital calibration circuit further comprises:
   a calibration counter circuit connected to said sample gate output line and to said feedback line, and having a counter output bus wherein in response to said sample gate signal having said second state, said calibration counter circuit counts a signal on said feedback line.

5. A digital delay circuit as in claim 4 wherein said digital calibration circuit further comprises:
   a count decoder circuit connected to said counter output bus, and having a delay time select bus wherein in response to a signal on said counter output bus, said count decoder circuit generates a signal on said delay time select bus to select a time delay.

6. A digital delay circuit as in claim 5 wherein said digital delayed signal generator further comprises
   an output signal selector connected to said plurality of signal delay taps, said feedback line, said delay time select bus, said delayed signal output line, and said sample gate output line
      wherein in response to said sample gate signal having said first state on said sample gate output line and said signal on said delay time select bus, said output signal selector passes one signal from said plurality of signal delay taps to said delayed signal output line; and
      in response to said sample gate signal having said second state, said output signal selector connects said delay tap in said plurality of signal delay taps having said specified time delay to said feedback line.

7. A digital delay circuit as in claim 1 wherein said digital calibration circuit further comprises a delay time select bus wherein upon said sample gate signal going from said second state to said first state, said digital calibration circuit generates a signal on said delay time select bus to select a time delay for an input signal on said signal input line.

8. A digital delay circuit as in claim 7 wherein said digital delayed signal generator further comprises an output signal selector connected to said plurality of signal delay taps, said feedback line, said delay time select bus, said delayed signal output line, and said sample gate output line wherein in response to a sample gate signal having said first state on said sample gate output line and a signal on said delay time select bus, said output signal selector passes one signal from said plurality of signal delay taps to said delayed signal output line; and in response to said sample gate signal having said second state, said output signal selector connects said delay tap in said plurality of signal delay taps having said specified time delay to said feedback line.

9. A digital delay circuit as in claim 1 wherein said digital signal delay chain comprises a ring oscillator.

10. A digital delay circuit as in claim 1 wherein said digital signal delay chain comprises a plurality of logic gates.

11. The digital delay circuit as in claim 1 wherein delayed signal output line is coupled to a filter.

12. The digital delay circuit as in claim 11 wherein said filter is a deglitching filter.

13. The digital delay circuit as in claim 1 wherein delayed signal output line is coupled to a data separator.

14. A digital delay circuit comprising:
a digital calibration circuit having:
a calibration control input line;
a feedback input terminal;
a sample gate output line; and
a delay time select bus
wherein in response to an active signal on said calibration control input line, said digital calibration circuit generates a sample gate signal having a second state on said sample gate output line to place said digital delay circuit in an auto-calibration mode; and a digital delayed signal generator connected to said delay time select bus and to said sample gate output line, and having:
a signal input line;
a delayed signal output line;
a feedback input terminal;
a feedback line connected to said feedback input terminal of said digital calibration circuit and to said feedback input terminal of said digital delayed signal generator; and
a digital signal delay chain having an input terminal coupled to said signal input line and to said feedback input terminal, and a plurality of signal delay taps;
wherein in response to a signal on said delay time select bus and a first state of said sample gate signal, said digital delayed signal generator connects one of said plurality of signal delay taps to said delayed signal output line for a normal delay mode of operation; and
in response to said sample gate signal having said second state, said feedback input terminal of said digital delayed signal generator is connected to said input terminal of said digital signal delay chain, and a delay tap in said plurality of signal delay taps having a specified time delay is connected to said feedback line.

15. A digital delay circuit as in claim 14 wherein said a digital calibration circuit further comprises:

a calibration control logic circuit connected to said calibration control input line and to said sample gate output line wherein said calibration control logic circuit generates said sample gate signal having said second state on said sample gate output line in response to said active signal on said calibration control input line.

16. A digital delay circuit as in claim 15 wherein said a digital calibration circuit further comprises:

a calibration counter circuit connected to said sample gate output line and to said feedback input terminal, and having a counter output bus wherein in response to said sample gate signal having said second state, said calibration counter circuit counts oscillations of a signal on said feedback input terminal.

17. A digital delay circuit as in claim 16 wherein said digital calibration circuit further comprises:

a count decoder circuit connected to said counter output bus, and to said delay time select bus wherein in response to a signal on said counter output bus, said count decoder circuit generates a said signal on said delay time select bus to select a time delay for a signal on said signal input line.

18. The digital delay circuit as in claim 14 wherein said signal on said delayed signal output line of said digital delay circuit is coupled to a filter.

19. The digital delay circuit as in claim 18 wherein said filter is a deglitching filter.

20. The digital delay circuit as in claim 14 wherein said delayed signal output line of said digital delay circuit is coupled to a data separator.

21. A method for generating a delayed output signal using a digital circuit comprising:

calibrating a time delay of a digital delay chain having a plurality of signal delay taps to obtain a calibrated time delay by connecting an input terminal of said digital delay chain to a delay tap in said plurality of signal delay taps having a specified time delay wherein said digital delay chain is included in said digital circuit; and selecting one of said plurality of signal delay taps, using said calibrated time delay, wherein said selected one of said plurality of signal delay taps supplies, in response to an input signal to said digital circuit, the delayed output signal to a delayed signal output line of said digital circuit.

22. The method of claim 21 wherein calibrating a time delay further comprises:

generating a sample gate signal having a second state in response to an active signal on a calibration control input line of a digital calibration circuit wherein said sample gate signal is generated on a sample gate output line of said digital calibration circuit and said input terminal of said digital delay chain is connected to said delay tap in said plurality of signal delay taps having said specified time delay in response to said sample gate signal having said second state.

23. The method of claim 22 wherein generating said sample gate signal having said second state on said sample gate output line in response to said active signal on said calibration control input line further comprises:

generating said sample gate signal by a calibration control logic circuit connected to said calibration control input line and to said sample gate output line.

24. The method of claim 21 wherein calibrating a time delay further comprises:

counting a signal from said delay tap in said plurality of signal delay taps having said specified time delay to obtain a count.

25. The method of claim 24 wherein calibrating a time delay further comprises:

decoding said count to obtain a signal representing said calibrated time delay.

26. The method of claim 25 wherein calibrating a time delay further comprises:

applying said signal representing said calibrated time delay to an output signal selector connected to said plurality of signal delay taps wherein said output signal selector passes one signal from said plurality of signal delay taps to said delayed signal output line and said one signal is said delayed output signal.

* * * * *